(12) United States Patent
Goto et al.

(10) Patent No.: US 7,919,814 B2
(45) Date of Patent: Apr. 5, 2011

(54) SEMICONDUCTOR DEVICE WITH INTEGRATED CIRCUIT ELECTRICALLY CONNECTED TO A MEMS SENSOR BY A THROUGH-ELECTRODE

(75) Inventors: Yasushi Goto, Kokubunji (JP); Tsukasa Fujimori, Higashimurayama (JP); Heewon Jeong, Tokyo (JP); Kiyoko Yamanaka, Tachikawa (JP)

(73) Assignee: Hitachi, Ltd., Tokyo (JP)

( * ) Notice: Subject to any disclaimer, the term of this patent is extended or adjusted under 35 U.S.C. 154(b) by 105 days.

(21) Appl. No.: 12/270,463

(22) Filed: Nov. 13, 2008

(65) Prior Publication Data
US 2009/0134459 A1 May 28, 2009

(30) Foreign Application Priority Data

Nov. 16, 2007 (JP) ................................. 2007-297854

(51) Int. Cl.
*H01L 27/12* (2006.01)
(52) U.S. Cl. ................ 257/350; 257/415; 257/E27.027; 257/E27.112
(58) Field of Classification Search .................. 257/347, 257/350, 415, E27.027, E27.112
See application file for complete search history.

(56) References Cited

U.S. PATENT DOCUMENTS

| 7,512,038 | B2 | 3/2009 | Machida et al. | |
|---|---|---|---|---|
| 7,687,833 | B2 * | 3/2010 | Marty et al. | 257/254 |
| 2005/0110159 | A1 * | 5/2005 | Oh et al. | 257/777 |
| 2007/0281381 | A1 * | 12/2007 | Ayazi | 438/52 |
| 2008/0203556 | A1 * | 8/2008 | Huang | 257/698 |
| 2008/0302184 | A1 | 12/2008 | Yamaguchi et al. | |
| 2009/0189480 | A1 | 7/2009 | Machida et al. | |

FOREIGN PATENT DOCUMENTS

| JP | 3-94169 | 4/1991 |
|---|---|---|
| JP | 2001-304996 | 10/2001 |
| JP | 2004-271312 | 9/2004 |
| JP | 2005-43159 | 2/2005 |
| JP | 2005-169541 | 6/2005 |
| JP | 2005-172690 | 6/2005 |
| JP | 2007-263763 | 10/2007 |
| JP | 2007-274279 | 10/2007 |
| JP | 2008-304218 | 12/2008 |

OTHER PUBLICATIONS

Japanese Office Action in Japanese Patent Application No. 2007-297854, mailed Apr. 20, 2010.
Translation of Notification of Reasons for Refusal in Japanese Patent Application No. 2007-297854, dispatched Apr. 20, 2010.

* cited by examiner

*Primary Examiner* — Benjamin P Sandvik
*Assistant Examiner* — W. Wendy Kuo
(74) *Attorney, Agent, or Firm* — Brundidge & Stanger, P.C.

(57) ABSTRACT

As well as achieving both downsizing and thickness reduction and sensitivity improvement of a semiconductor device that has: a MEMS sensor formed by bulk micromachining technique such as an acceleration sensor and an angular rate sensor; and an LSI circuit, a packaging structure of the semiconductor device having the MEMS sensor and the LSI circuit can be simplified. An integrated circuit having MISFETs and wirings is formed on a silicon layer of an SOI substrate, and the MEMS sensor containing a structure inside is formed by processing a substrate layer of the SOI substrate. In other words, by using both surfaces of the SOI substrate, the integrated circuit and the MEMS sensor are mounted on one SOI substrate. The integrated circuit and the MEMS sensor are electrically connected to each other by a through-electrode provided in the SOI substrate.

10 Claims, 34 Drawing Sheets

SEMICONDUCTOR DEVICE WITH INTEGRATED CIRCUIT ELECTRICALLY CONNECTED TO A MEMS SENSOR BY A THROUGH-ELECTRODE

CROSS-REFERENCE TO RELATED APPLICATION

The present application claims priority from Japanese Patent Application No. JP 2007-297854 filed on Nov. 16, 2007, the content of which is hereby incorporated by reference into this application.

TECHNICAL FIELD OF THE INVENTION

The present invention relates to a semiconductor device and a manufacturing technique of the same, and more particularly, it relates to a technique effectively applied to a semiconductor device that includes a MEMS (Micro Electro Mechanical Systems) and an LSI (Large Scale Integrated circuit) and manufacturing techniques of the same.

BACKGROUND OF THE INVENTION

In Japanese Patent Application Laid-Open Publication No. 2005-169541 (Patent Document 1), there is described a structure of an acceleration sensor in which a MEMS chip having a MEMS formed therein and an IC chip having an IC (Integrated Circuit) formed therein are arranged so as to oppose to each other at a predetermined spacing therebetween. Particularly, in order to achieve both downsizing and thickness-reduction of the acceleration sensor and improvement of a detection sensitivity of the acceleration sensor, the IC chip which electrically processes detection signals from the MEMS chip also functions as a regulation board. In order to prevent electrical contact between the MEMS chip and the IC chip caused by shock from the outside, an insulating layer is formed on the surface of the IC chip that opposes to the MEMS chip. In the acceleration sensor thus formed, the MEMS chip and the IC chip, which are disposed so as to oppose to each other with the predetermined spacing therebetween, are connected to each other by bonding wires, and the MEMS chip and the IC chip configuring the acceleration sensor are hermetically sealed by packaging.

In Japanese Patent Application Laid-Open Publication No. 2004-271312 (Patent Document 2), there is described a capacitor-type semiconductor sensor which mounts a MEMS chip on a circuit chip by using bump electrodes. An object of this technique is to eliminate fluctuations of a parasitic capacitance generated between adjacent bonding wires when the gaps between the bonding wires are narrowed along with increase of the degree of integration in the case where an electrical connection between the MEMS chip and the circuit chip is formed by the bonding wires. In order to achieve this object, the electrical connection between the MEMS chip and the circuit chip is formed by bump electrodes instead of wire bonding. Therefore, the parasitic capacitance generated between the bonding wires can be eliminated, and deterioration of detection accuracy caused along with the fluctuations of the parasitic capacitance can be prevented. Also in this technique, the MEMS chip and the circuit chip are hermetically sealed by a package.

In Japanese Patent Application Laid-Open Publication No. 2005-172690 (Patent Document 3), there is described a hermetic sealing method of a MEMS structure using an anodic bonding of glass substrates and a silicon substrate. Specifically, the MEMS structure is hermetically sealed by anodically bonding between the glass substrates and the silicon substrate under a reduced pressure. Herein, in the anodic bonding, a residual gas generated in the sealed space in which the MEMS structure is disposed can be removed by carrying out heating treatment by a predetermined temperature and time, and the pressure of the sealed space in which the MEMS structure is disposed can be reduced to a state close to vacuum. Thus, without disposing a getter or the like for oxygen absorption in the sealed space in which the MEMS structure is disposed, the pressure of the sealed space can be reduced to the state close to vacuum, a sealing case can be downsized, and also manufacturing steps of the sensor can be simplified, thereby improving production efficiency.

SUMMARY OF THE INVENTION

A MEMS sensor is formed by forming a three-dimensional structure on such ad a Si substrate and an SOI (Silicon on Insulator) substrate by using semiconductor manufacturing techniques, and measuring mechanical deformations of the structure as electrical signals and electrically controlling mechanical movement.

For example, an acceleration sensor which is one of MEMS sensors comprises a mass and suspension beams, and it converts an acceleration that acts on the mass to electrical signals. The MEMS sensors are distinguished by methods of conversion into the electrical signals, for example, a piezo resistance method utilizing voltage signals generated by an elastic deformation of piezoelectric elements (piezo elements) or an electrostatic capacitance method which detects an acceleration as a capacitance variation between electrodes constituting a capacitance; however, in any case, the acceleration that acts on the mass is transduced as variations of resistance, capacitance, etc., and it is converted to electrical signals by an LSI circuit and used as an output of the MEMS sensor.

While these MEMS sensors represented by acceleration sensors and angular rate sensors have been developed for airbag control of automobiles, currently, they are employed in motion control of, for example, controllers of game machines and portable phones. In order to use them in such commercial devices and small portable terminals, downsizing, cost reduction, and simplification of packaging methods of the MEMS sensors are necessary.

In the techniques described in Patent Documents 1 to 3, there are disclosed methods for achieving both downsizing and thickness reduction and sensitivity enhancement or detection accuracy improvement of a semiconductor device including a MEMS sensor and an LSI circuit. In these methods, the semiconductor chip forming the MEMS sensor and a semiconductor chip forming the LSI circuit are separately manufactured. Then, a structure is employed such that the semiconductor chips are arranged being stacked, and semiconductor chips under the stacked arrangement are sealed in a package. Therefore, downsizing has a limit.

Meanwhile, as a hermetic sealing structure of a structure constituting a MEMS sensor, there is a hermetic sealing method of glass substrates and a semiconductor substrate (Si substrate) using anodic bonding as represented by Patent Document 3. In this method, after the structure constituting a MEMS sensor is formed on the semiconductor substrate, electrodes for forming electrical connections between the structure and the outside have to be formed on the glass substrates by a method such as sandblasting. Therefore, the process thereof is complex.

An object of the present invention is to simplify packaging structure of a semiconductor device including a MEMS sensor and an LSI circuit while achieving both downsizing and thickness reduction and sensitivity enhancement of the semiconductor device including the MEMS sensor and the LSI circuit formed by bulk micromachining techniques such as an acceleration sensor or an angular rate sensor.

The above and other objects and novel characteristics of the present invention will be apparent from the description of the present specification and the accompanying drawings.

The typical ones of the inventions disclosed in the present application will be briefly described as follows.

According to a typical embodiment, there are provided: (a) an SOI substrate having a substrate layer, a buried insulating layer formed on the substrate layer, and a semiconductor layer formed on the buried insulating layer; (b) an integrated circuit formed on the semiconductor layer of the SOI substrate; and (c) a semiconductor element formed by processing the substrate layer of the SOI substrate.

Here, the integrated circuit has: (b1) a plurality of MISFETs formed on the semiconductor layer; and (b2) wirings electrically connecting the plurality of MISFETs. And, the semiconductor element has: (c1) a fixing portion formed by processing the substrate layer; (c2) a structure body mechanically connected to the fixing portion and movable; and (c3) a cavity portion formed so as to surround the structure body. At this time, a feature lies in that the integrated circuit and the semiconductor device are electrically connected, and the electrical connections between the integrated circuit and the semiconductor device are made by through-electrodes formed in the inside of the SOI substrate.

When such a configuration is employed, downsizing and thickness reduction can be realized by forming the LSI circuit (integrated circuit) on one surface of the SOI substrate and forming the MEMS sensor (semiconductor element) on the other surface thereof, compared with the case where the MEMS sensor and the LSI circuit are formed on different semiconductor substrates. In addition, when the MEMS sensor and the LSI circuit are electrically connected to each other by the through-electrodes penetrating through the buried insulating layer, sensitivity and detection accuracy improvement can be achieved.

The effects obtained by typical aspects of the present invention will be briefly described below.

In an SOI substrate having a substrate layer, a buried insulating layer buried in the substrate layer, and a silicon layer formed on the buried insulating layer, an LSI circuit is formed on the silicon layer, and on the other hand, a MEMS sensor is formed by processing the substrate layer. In other words, the LSI circuit is formed on one surface of the SOI substrate, and the MEMS sensor is formed on the other surface thereof, thereby realizing downsizing and thickness reduction compared with the case where the MEMS sensor and the LSI circuit are formed on different semiconductor substrates.

The LSI circuit formed on the silicon layer and the MEMS sensor formed in the substrate layer are configured to be directly connected to each other by through-electrodes penetrating through the buried insulating layer. Therefore, although a parasitic capacitance fluctuation between wires is generated in the case where the LSI circuit and the MEMS sensor are connected by wire bonding, parasitic capacitance fluctuations can be suppressed, and the sensitivity enhancement and detection accuracy improvement of the MEMS sensor can be achieved in the configuration in which the LSI circuit and the MEMS sensor are directly connected to each other by the through-electrodes. In other words, both downsizing and thickness reduction of the semiconductor device, and sensitivity enhancement and detection accuracy improvement can be achieved by forming the MEMS sensor and the LSI circuit on the same SOI substrate and electrically connecting the MEMS sensor and the LSI circuit to each other by the through-electrode penetrating through the buried insulating layer.

Furthermore, external draw-out electrodes can be provided in the side where the LSI is formed also in the case where the structure constituting the MEMS sensor is hermetically sealed; therefore, there is no need to form opening portions in a cap hermetically sealing the structure to form external draw-out electrodes. Consequently, the step of hermetically sealing the structure configuring the MEMS sensor can be simplified, and reliability of the bonding surfaces of the cap and the MEMS sensor can be improved.

BRIEF DESCRIPTIONS OF THE DRAWINGS

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it can be conceived that they are apparently excluded in principle. The same goes for the numerical value and the range described above.

Also, components having the same function are denoted by the same reference symbols throughout the drawings for describing the embodiments, and the repetitive description thereof is omitted. Also, in some drawings used in the embodiments, hatching is used even in a plan view so as to make the drawings easy to see.

First Embodiment

Figure 1:
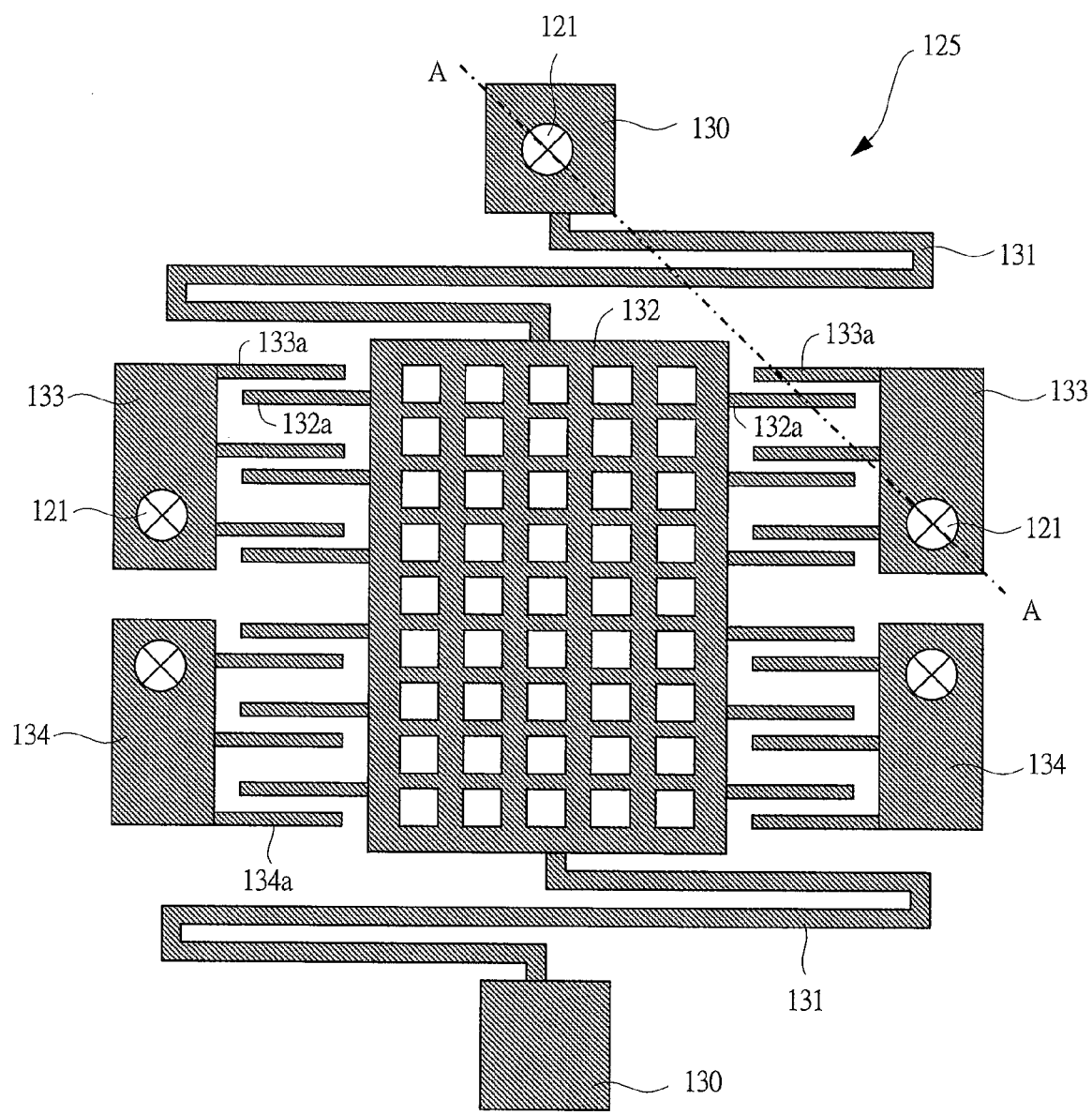
FIG. 1 is a plan view showing a configuration of a MEMS sensor according to a first embodiment of the present invention.

A semiconductor device of a first embodiment will be described with reference to the drawings. FIG. 1 is a plan view showing a MEMS sensor according to the first embodiment. In FIG. 1, the MEMS sensor in the present first embodiment is, for example, an acceleration sensor. The MEMS sensor comprises fixing portions 130 formed on an SOI substrate and a structure 125 connected to the fixing portions 130. The structure 125 comprises beams 131, a movable mass 132, and detection portions 133 and 134.

The beams 131 are elastically deformable and connect the fixing portions 130 and the movable mass 132. Therefore, the movable mass 132 can be displaced when an external force is applied. The fixing portions 130, the beams 131, and the movable mass 132 are formed by processing conductive silicon, and are not only mutually mechanically connected, but also are electrically connected.

Movable electrodes 132a are formed on the movable mass 132 and constitute detection capacitor elements in combination with fixed electrodes 133a which are formed on the detection portions 133. More specifically, when an upward acceleration acts on to displace the movable mass 132, the detection portions 133 detect the displacement as a capacitance change of the detection capacitor elements. Similarly, fixed electrodes 134a are formed on the detection portion 134 and constitute detection capacitor elements in combination with the movable electrodes 132a formed on the movable mass 132. The MEMS sensor (acceleration sensor) in the first embodiment has the detection portions 133 that are sensitive to an acceleration in the upward direction of the paper and the detection portions 134 that are sensitive to an acceleration in the downward direction of the paper.

The movable electrodes 132a formed on the movable mass 132 are electrically connected to the beams 131 and the fixing portions 130, which are connected to the movable mass 132, and are indirectly connected to a through-electrode 121, which is connected to the fixing portion 130. On the other hand, the fixed electrodes 133a and the fixed electrodes 134a, which are formed on the detection portions 133 or the detection portions 134, are connected to the through-electrodes 121 that reach the detection portions 133 or the detection portion 134. According to this, input/output of the detection capacitor elements can be controlled by the through-electrode 121 connected to the fixing portion 130 and the through-electrodes 121 connected to the detection portions 133 and 134.

While the MEMS sensor configured in this manner is formed on the SOI substrate, furthermore, an integrated circuit (LSI) is also formed on the SOI substrate. The manner how the MEMS sensor and the integrated circuit are formed on the SOI substrate will be described by using cross-sectional views.

Figure 2:
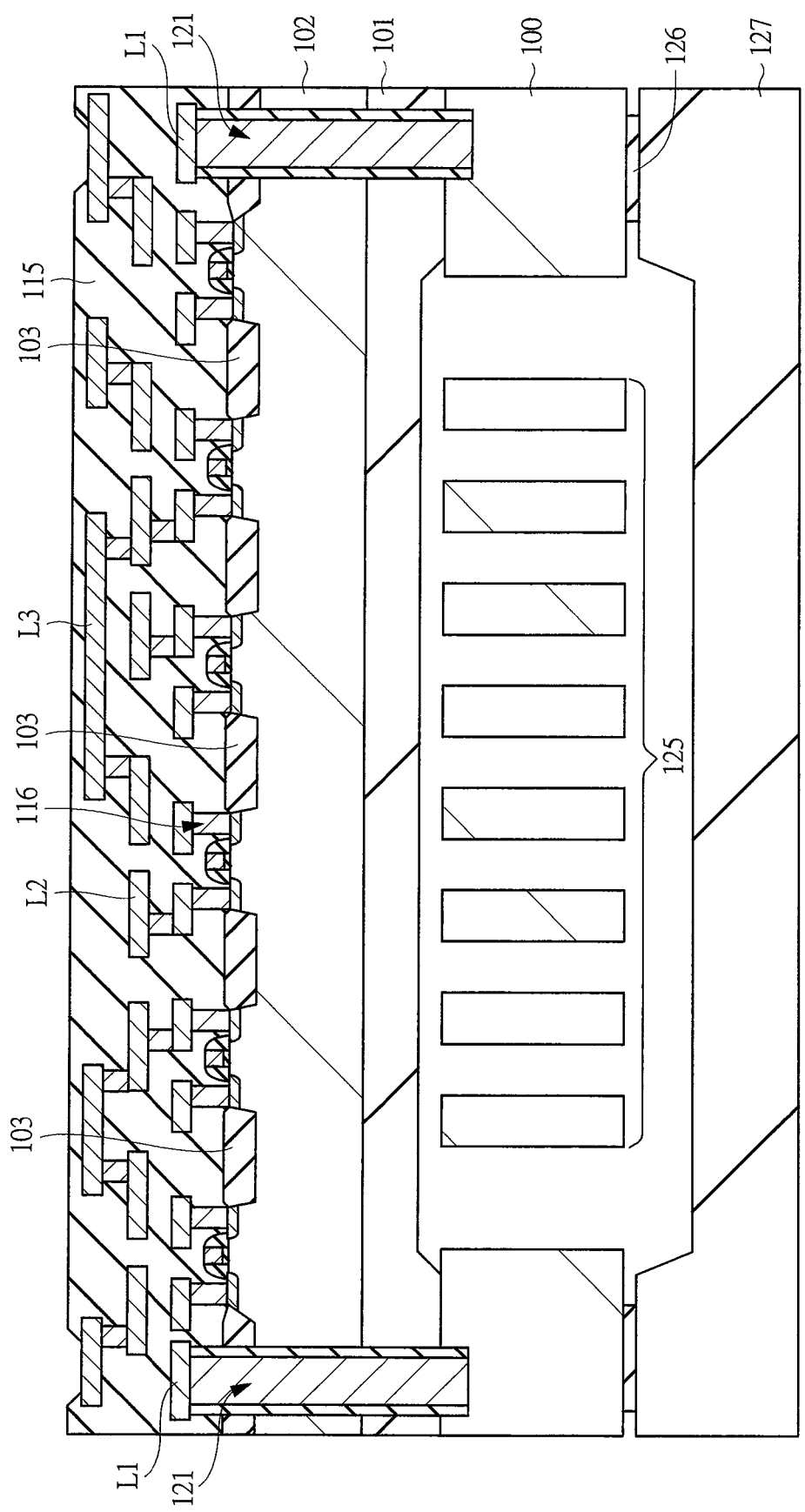
FIG. 2 is a cross-sectional view showing a configuration of a semiconductor device according to the first embodiment.

FIG. 2 is a cross-sectional view showing a configuration of the semiconductor device of the first embodiment and it shows a cross section cut along the line A-A of FIG. 1. In FIG. 2, the semiconductor device of the first embodiment has a configuration in which the integrated circuit (LSI) is formed on one surface of the SOI substrate, and the MEMS sensor is formed on the other surface.

More specifically, the SOI substrate is configured by a substrate layer 100, a buried insulating layer 101 formed on the substrate layer 100, and a silicon layer (device layer) 102 formed on the buried insulating layer (BOX layer) 101. The substrate layer 100 is formed of a silicon single crystal and has a thickness of about 400 μm. The buried insulating layer 101 is formed of, for example, a silicon oxide film and has a thickness of about 5 μm. And, the silicon layer 102 is formed of silicon and has a thickness of about 100 μm.

In this manner, the SOI substrate refers to a substrate having a silicon single crystal formed on an insulator.

Isolation regions 103 are formed in the silicon layer 102, which constitutes the SOI substrate, thereby dividing active regions in which devices are formed. In the active regions divided by the isolation regions 103, MISFETs (Metal Insulator Semiconductor Field Effect Transistors) are formed.

The MISFET has, for example, a gate insulating film formed on the silicon layer 102 and a gate electrode formed on the gate insulating film. In addition, sidewalls are formed on side walls of both sides of the gate electrode. Furthermore, in the silicon layer 102, which is aligned with the gate electrode, a source region and a drain region which are semiconductor regions are formed. The MISFETs formed in this manner include an n-channel type MISFET in which the source region and the drain region are formed of n-type impurity diffusion regions into which an n-type impurity such as phosphorous, arsenic, etc. is introduced and a p-channel type MISFET in which the source region and the drain region are formed of p-type impurity diffusion regions into which a p-type impurity such as boron is introduced.

For example, in the n-channel type MISFET, when a positive voltage more than or equal to a threshold voltage is applied to the gate electrode in the state in which a potential difference is given between the source region and the drain region, a channel is formed in the silicon layer 102 immediately below the gate electrode. Consequently, the source region and the drain region are connected to each other by the channel, so that the MISFET is caused to be in an on state. On the other hand, when a voltage less than or equal to the threshold voltage is applied to the gate electrode, the channel is not formed in the silicon layer 102 immediately below the gate electrode. Therefore, the source region and the drain region are electrically disconnected from each other, so that the MISFET is caused to be in an off state. The on/off state of the MISFET can be controlled by controlling the voltage applied to the gate electrode of the MISFET in this manner.

In the first embodiment, the MISFETs are formed on the silicon layer 102 of the SOI substrate, and the isolation regions 103 are formed in an upper portion of the silicon layer 102; however, when the isolation regions are extended to the buried insulating layer 101, so that isolation is completely achieved and a capacitance of the source region or the drain region is reduced. Therefore, there are advantages that improvements of the integration density and the operation speed, an increase of a withstand voltage, and a latch-up-free implementation can be realized.

Next, on the silicon layer 102 on which the MISFETs are formed, an interlayer insulating film 115 formed of, for example, a silicon oxide film, is formed, and a multilayered wiring is formed in the interlayer insulating film 115. FIG. 2 shows, as an example of the multilayered wiring, a first-layer wiring L1, a second-layer wiring L2 formed on the first-layer wiring L1, and a third-layer wiring L3 formed on the second-layer wiring L2. In FIG. 2, the third-layer wiring L3 is the uppermost-layer wiring, and part of the third-layer wiring L3 is made as bonding pads. The bonding pads are exposed from the interlayer insulating film 115 and, for example, configured to be connected to external wirings (external terminals) via wires.

As described above, the plurality of MISFETs and the wirings electrically connecting the MISFETs are formed on the silicon layer 102, which constitutes the SOI substrate. The integrated circuit (LSI) comprises these MISFETs and the wirings. In other words, in the first embodiment, the integrated circuit is formed on one of the surfaces of the SOI substrate on which the silicon layer 102 is formed.

Subsequently, the configuration of the MEMS sensor formed on the SOI substrate will be described. In FIG. 2, the MEMS sensor is formed in the substrate layer 100 of the SOI substrate. That is, the MEMS sensor is formed by processing the substrate layer 100, which constitutes the SOI substrate. Examples of the MEMS sensor include an acceleration sensor and an acceleration sensor. The MEMS sensor has the fixing portions fixed to the substrate layer 100 and the structure 125 mechanically connected to the fixing portions. The structure 125 is formed by processing the substrate layer 100 and is disposed in a cavity portion provided in the substrate layer 100. Therefore, the structure 125 is configured so as to be movable. The structure 125 has the elastically deformable beams and the movable mass. More specifically, the fixing portions and the movable mass of the MEMS sensor are mutually connected by the beams, and the structure is configured so that the movable mass can be moved when an external force is applied to the MEMS sensor. The structure 125 of the MEMS sensor is hermetically sealed by a cap 127. The sealing by the cap 127 is carried out, for example, by metal bonding by a metal 126 or glass anodic bonding by a glass cap.

In this manner, in the first embodiment, semiconductor devices are formed on both sides of one SOI substrate. In other words, the integrated circuit having the MISFETs and the wirings are formed in the silicon layer 102 of the SOI substrate, and the MEMS sensor having the structure 125 is formed in the substrate layer 100 at the opposite side of the silicon layer 102.

Next, operations of the MEMS sensor will be described. For example, as an example of the MEMS sensor, operations of a capacitance detection type MEMS sensor will be described. As shown in FIG. 1 and FIG. 2, in the substrate layer 100 of the SOI substrate, the structure 125 constituting the MEMS sensor is provided. The structure 125 is provided in the cavity portion, which is hermetically sealed by the cap 127, and, when an external force is applied, the movable mass 132 constituting the structure 125 is moved. That is, since the movable mass 132 is connected to the fixing portions 130 via the elastically deformable beams 131, when an external force acts on the SOI substrate, the movable mass 132 is displaced in accordance with the magnitude of the acceleration. Herein, for example, the movable electrodes 132a are formed on the movable mass 132, which can be moved, and the fixed electrodes 133a and 134a are formed on the detection portions 133 and 134 so as to be opposed to the movable electrodes 132a. In other words, each of the movable mass 132 and the detection portions 133 and 134 is provided with the electrodes, and these electrodes are configured to be parallel plates, thereby forming capacitor elements. Therefore, when the movable mass 132 receives the external force and is displaced, the movable electrodes 132a provided on the movable mass 132 are also displaced. Thus, the distances between the movable electrodes 132a and the fixed electrodes 133a and 134a, and the areas by which they are planarly overlapped with each other are changed; therefore, the capacitance of the capacitor elements which comprise the movable electrodes 132a and the fixed electrodes 133a and 134a is changed. The capacitance change is electrically detected by the integrated circuit via the through-electrodes 121, so that the acceleration is indirectly detected. Note that, while the first embodiment is described by using the capacitance detection type MEMS sensor as an example, it is not limited thereto, and a MEMS sensor using piezoelectric elements can be also used. For example, in a MEMS sensor using piezoelectric elements, a displacement of the structure 125 is transmitted to the piezoelectric elements. Then, since the piezoelectric elements generate a voltage in accordance with the degree of deformation, an external force (acceleration or pressure) can be detected by detecting the voltage change.

As described above, in the semiconductor device of the first embodiment, the MEMS sensor detects, for example, the acceleration applied to the SOI substrate as a capacitance change, and the capacitance change detected by the MEMS sensor is electrically processed by the integrated circuit to be detected as an electrical signal. Therefore, the MEMS sensor and the integrated circuit are required to be electrically connected. Accordingly, in the following, a connection configuration of the MEMS sensor and the integrated circuit will be described.

As shown in FIG. 2, in the semiconductor device of the first embodiment, the SOI substrate is used. And, in the silicon layer 102 side of the SOI substrate, the integrated circuit having the MISFETs and wirings is formed; on the other hand, the MEMS sensor having the structure 125 being able to be displaced is formed by processing the substrate layer 100 of the SOI substrate. Therefore, the integrated circuit and the MEMS sensor formed on the SOI substrate are electrically insulated from each other by the buried insulating layer 101, which is provided inside the SOI substrate. However, as described above, the integrated circuit and the MEMS sensor are necessary to be electrically connected to each other. This connection is achieved by the through-electrodes 121 formed in the SOI substrate. In other words, in the first embodiment, the integrated circuit and the MEMS sensor are electrically connected to each other by the through-electrodes 121 penetrating through the interior (buried insulating layer 101) of the SOI substrate. Specifically, in FIG. 2, the through-electrode electrically connects the first-layer wiring L1, which constitutes the integrated circuit, and the fixing portion (substrate layer 100) of the MEMS sensor. Thus, the integrated circuit and the MEMS sensor formed on the opposite surfaces of the SOI substrate can be connected to each other by the through-electrodes 121 penetrating through the interior of the SOI substrate. The through-electrode 121 is formed by burying a conductive material in a hole. However, if the conductive material is merely buried in the hole, it is also electrically connected to the silicon layer 102 of the SOI substrate since the silicon layer 102 of the SOI substrate is a semiconductor region. Therefore, on the inner wall of the hole, for example, an insulating film formed of a silicon oxide film is formed. Thus, it can be electrically insulated from the silicon layer 102 which is in contact with the inner wall of the hole. Meanwhile, the first-layer wiring L1 of the integrated circuit, which is in contact with an upper portion of the through-electrode 121, and the substrate layer (fixing portion) 100 of the MEMS sensor, which is in contact with a bottom portion of the through-electrode 121, can be electrically connected.

The semiconductor device of the first embodiment is configured in the abovedescribed manner, and features of the same will be described. First of all, a first feature point is the point that the SOI substrate is used as a semiconductor substrate. More specifically, as a result of using the SOI substrate as a semiconductor substrate, different semiconductor elements can be respectively formed on both sides of the SOI substrate in the state where they are electrically insulated. By virtue of the SOI substrate, as shown in FIG. 2, since the substrate layer 100 and the silicon layer 102 can be electrically isolated by the buried insulating layer 101, the first embodiment focuses on the point that the semiconductor elements can be formed on both surfaces of the SOI substrate.

Conventionally, in a semiconductor device in which an integrated circuit having MISFETs and wirings and a MEMS sensor are combined, a semiconductor chip forming the integrated circuit and a semiconductor chip forming the MEMS sensor are separately formed. Therefore, when the semiconductor chip forming the integrated circuit and the semiconductor chip forming the MEMS sensor are disposed at planarly different positions, the area of the whole semiconductor device is increased, and there is a problem that downsizing cannot be realized. In order to solve this problem, it is conceivable to stack the semiconductor chip forming the integrated circuit and the semiconductor chip forming the MEMS sensor to reduce the occupied area. However, even when the semiconductor chip forming the integrated circuit and the semiconductor chip forming the MEMS sensor are stacked, there is still a problem that the thickness is large and that a thin plate cannot be realized since different semiconductor chips are stacked. Furthermore, downsizing is obstructed since the semiconductor chip forming the integrated circuit and the semiconductor chip forming the MEMS sensor are necessary to be electrically connected, and a bonding area for connecting wires is required to be ensured.

Accordingly, in the first embodiment, the integrated circuit and the MEMS sensor are formed on one SOI substrate. This point is one feature of the semiconductor device of the first embodiment. More specifically, as shown in FIG. 2, the integrated circuit having the MISFETs and wirings is formed on the silicon layer 102 of the SOI substrate, and the MEMS sensor including the structure 125 is formed by processing the substrate layer 100 of the SOI substrate. When both the surfaces of the SOI substrate are used in this manner, the integrated circuit and the MEMS sensor can be formed on one SOI substrate. Therefore, since merely one SOI substrate is used, downsizing can be realized, and thickness reduction can be also realized. Furthermore, since the electrical connection between the integrated circuit and the MEMS sensor is realized by the through-electrodes 121, which penetrate through the interior of the SOI substrate, wire connections are not required, and the bonding area is not required to be ensured. Consequently, downsizing of the semiconductor device having the integrated circuit and the MEMS sensor can be further promoted.

In addition, the effects to be described below can be also obtained since the electrical connection between the integrated circuit and the MEMS sensor is implemented by the through-electrodes 121 penetrating through the SOI substrate. More specifically, if the integrated circuit and the MEMS sensor are connected by wires, generations of parasitic capacitances between the plurality of wires and parasitic capacitance fluctuations become problematic. However, when the integrated circuit and the MEMS sensor are connected by the through-electrodes 121 penetrating through the interior of the SOI substrate as the first embodiment, the influence of the parasitic capacitances between the wires and the parasitic capacitance fluctuations can be suppressed. Thus, as a result of forming the integrated circuit and the MEMS sensor on both surfaces of the SOI substrate and connecting the integrated circuit and the MEMS sensor by the through-electrodes 121 penetrating through the interior of the SOI substrate, as well as downsizing and thickness reduction of the semiconductor device can be realized, a sensitivity increase and reliability improvement of the semiconductor device can be made.

Further, according to the first embodiment, effects to be described below are also obtained. For example, as shown in FIG. 2, the structure 125 of the MEMS sensor is hermetically sealed by the cap 127. Even in a semiconductor chip in which a normal MEMS sensor is formed, the structure of the MEMS sensor has to be hermetically sealed by a cap, and an external draw-out electrode is necessary to be formed on the cap for achieving an electrical connection between the MEMS sensor and the outside. Therefore, after the structure of the MEMS sensor is hermetically sealed by the cap, the external draw-out electrode is required to be formed by providing an opening portion to the cap. On the other hand, in the first embodiment, as shown in FIG. 2, the MEMS sensor is formed in the substrate layer 100 of the SOI substrate, and the MEMS sensor and the integrated circuit are connected by the through-electrodes 121. In other words, an external output of the MEMS sensor is connected to the integrated circuit via the through-electrode 121. Therefore, external draw-out electrode is not required to be formed in the cap which hermetically seals the MEMS sensor, and manufacturing steps of the semiconductor device can be thus simplified. According to the first embodiment, since the opening portion is not necessary to be formed in the cap, the factor that deteriorates the reliability of the hermetic sealing by the cap is eliminated. Consequently, the reliability of the hermetic sealing of the MEMS sensor can be improved.

Furthermore, according to the first embodiment, there is an advantage that draw-out wiring from the capacitor elements formed in the MEMS sensor can be simplified since the MEMS sensor and the integrated circuit are connected by the through-electrodes 121. For example, the structure 125 constituting the MEMS sensor is formed by processing the substrate layer 100 of the SOI substrate. Since the substrate layer 100 has a one-layer structure, in formation of the structure 125, the drawn-out wirings from the capacitor elements formed in the structure 125 has to be formed in the substrate layer 100. Therefore, since disposition of the draw-out wiring has to be taken into consideration in formation of the structure 125, this factor becomes a restriction in terms of layout of the MEMS sensor. However, according to the first embodiment, input/output of the capacitor elements can be drawn to the outside by the through-electrodes 121, which are connected to the structure 125; therefore, the flexibility of the layout configuration of the MEMS sensor is improved. In other words, it is unnecessary to form drawn wirings in the substrate layer 100, the wiring of the integrated circuit which is the connection destination of the through-electrodes 121 can be used; therefore, the flexibility of the layout in the substrate layer 100 to which the MEMS sensor is formed is improved.

Figure 3:
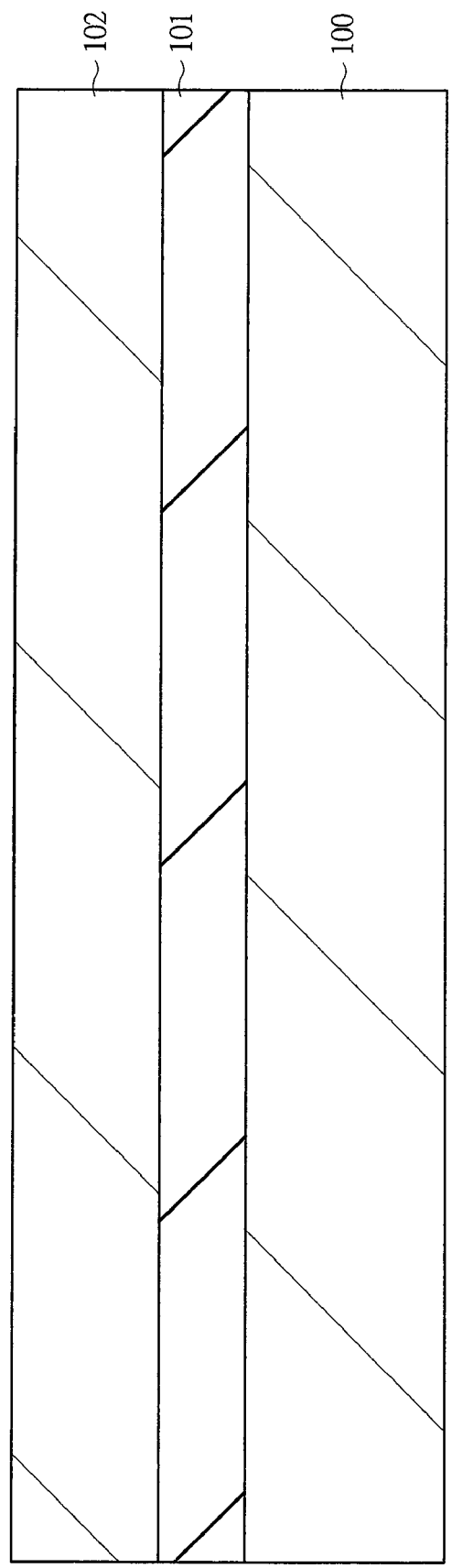
FIG. 3 is a cross-sectional view showing a manufacturing step of the semiconductor device according to the first embodiment.

Next, a method of manufacturing the semiconductor device of the first embodiment will be described with reference to the drawings. First of all, as shown in FIG. 3, an SOI substrate is prepared. The SOI substrate has the substrate layer 100, the buried insulating layer 101 formed on the substrate layer 100, and the silicon layer 102 formed on the buried insulating layer 101. The substrate layer 100 has a thickness of about 400 μm, the buried insulating layer 101 has a thickness of about 5 μm, and the silicon layer 102 has a thickness of about 100 μm.

Figure 4:
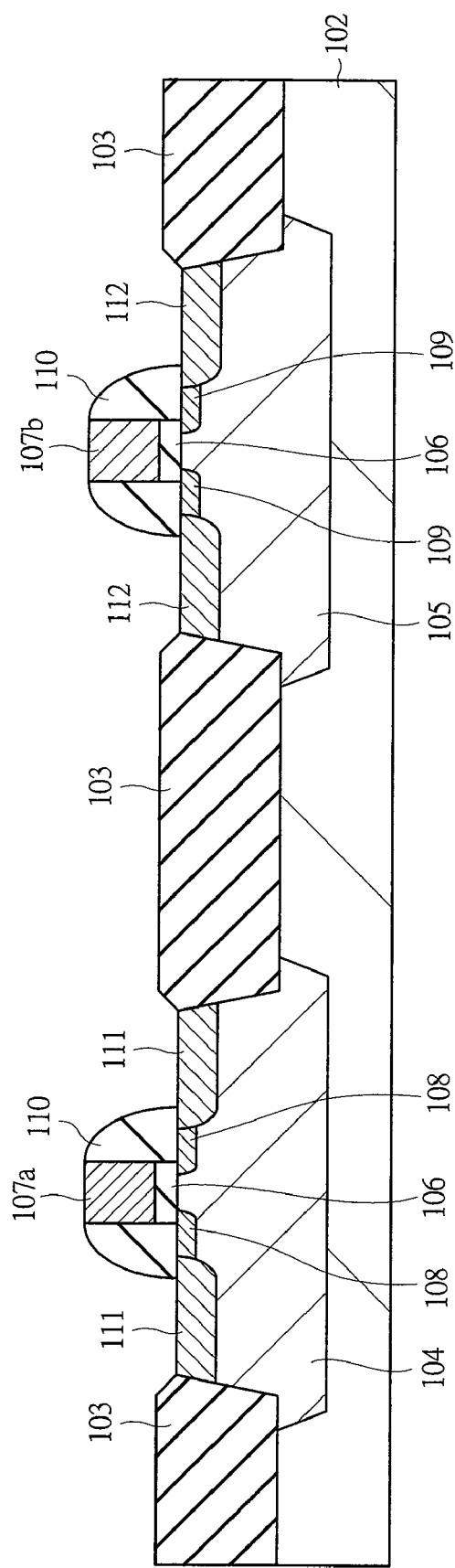
FIG. 4 is a cross-sectional view showing a manufacturing step of the semiconductor device continued from FIG. 3.

Subsequently, as shown in FIG. 4, MISFETs are formed on the silicon layer 102 of the SOI substrate. In FIG. 4, the silicon layer 102 of the SOI substrate is shown in an enlarged manner. Formation steps of the MISFETs shown in FIG. 4 will be described.

The SOI substrate is in a state of a semiconductor wafer having a substantially disk-like shape. Then, the isolation regions 103 which isolate between elements are formed in a CMISFET formation region of the SOI substrate. The isolation regions 103 are provided so that the elements do not interfere with each other. The isolation regions 103 can be formed by using, for example, the LOCOS (local Oxidation of silicon) method or the STI (shallow trench isolation) method. In the case where the isolation regions 103 are extended to the buried insulating layer 101, a deep trench isolation to bury an insulating film as processing the silicon layer 102 is used.

Next, an impurity is introduced into the active regions isolated by the isolation regions 103 to form wells. For example, in an n-channel type MISFET formation region among the active regions, a p-type well 104 is formed, and an n-type well 105 is formed in a p-channel type MISFET formation region. The p-type well 104 is formed, for example, by introducing a p-type impurity such as boron into the silicon layer 102 by ion implantation method. Similarly, the n-type well is formed, for example, by introducing an n-type impurity such as phosphorous (P) and arsenic (As) into the silicon layer 102 by ion implantation method.

Subsequently, semiconductor regions (not shown) for channel formation are formed in a surface region of the p-type well 104 and a surface region of the n-type well 105. Each of the semiconductor regions for channel formation is formed for adjusting the threshold voltage by which a channel is formed.

Next, a gate insulating film 106 is formed on the silicon layer 102. The gate insulating film 106 is formed of, for example, a silicon oxide film and can be formed by using, for example, a thermal oxidation method. However, the gate insulating film 106 is not limited to the silicon oxide film, and can be variously changed; for example, the gate insulating film 106 may be a silicon oxynitride film (SiON) or a high-dielectric gate insulating film of hafnium oxide, etc.

Subsequently, a polysilicon film is formed on the gate insulating film 106. The polysilicon film can be formed by using, for example, the CVD method. Then, an n-type impurity such as phosphorous or arsenic is introduced into the polysilicon film that is formed in the n-channel type MISFET formation region by using photolithography technique and ion implantation method. Similarly, a p-type impurity such as boron is introduced into the polysilicon film that is formed in the p-channel type MISFET formation region.

Next, the polysilicon film is processed by etching using a patterned resist film as a mask, thereby forming a gate electrode 107a in the n-channel type MISFET formation region and forming a gate electrode 107b in the p-channel type MISFET formation region.

Here, in the gate electrode 107a of the n-channel type MISFET formation region, the n-type impurity is introduced into the polysilicon film. Therefore, a work function value of the gate electrode 107a can be caused to be a value in the vicinity of the conduction band of silicon (4.15 eV); thus, the threshold voltage of the n-channel type MISFET can be reduced. On the other hand, in the gate electrode 107b of the p-channel type MISFET formation region, the p-type impurity is introduced into the polysilicon film. Therefore, a work function value of the gate electrode 107b is caused to be a value in the vicinity of the valence band of silicon (5.15 eV); thus, the threshold voltage of the p-channel type MISFET can be reduced. In this manner, in the first embodiment, the threshold voltages can be reduced in both the n-channel type MISFET and the p-channel type MISFET (dual-gate structure).

Subsequently, shallow n-type impurity diffusion regions 108 aligned with the gate electrode 107a of the n-channel type MISFET are formed by using photolithography technique and ion implantation method. The shallow n-type impurity diffusion regions 108 are semiconductor regions. Similarly, shallow p-type impurity diffusion regions 109 are formed in the p-channel type MISFET formation region. The shallow p-type impurity diffusion regions 109 are formed so as to be aligned with the gate electrode 107b of the p-channel type MISFET. The shallow p-type impurity diffusion regions 109 can be formed by using photolithography technique and ion implantation method.

Next, a silicon oxide film is formed on the SOI substrate. The silicon oxide film can be formed, for example, by using CVD method. Then, the silicon oxide film is subjected to anisotropic etching, thereby forming sidewalls 110 on the side walls of the gate electrodes 107a and 107b. The sidewall 110 is formed of a single-layer film of the silicon oxide film, but is not limited thereto; for example, a sidewall comprising a stacked film of a silicon nitride film and a silicon oxide film may be formed.

Subsequently, deep n-type impurity diffusion regions 111 aligned with the sidewalls are formed in the n-channel type MISFET formation region by using photolithography technique and ion implantation method. The deep n-type impurity diffusion regions 111 are semiconductor regions. A source region is formed by the deep n-type impurity diffusion region 111 and the shallow n-type impurity diffusion region 108. Similarly, a drain region is formed by the deep n-type impurity diffusion region 111 and the shallow n-type impurity diffusion region 108. When the source region and the drain region are formed by the shallow n-type impurity diffusion regions 108 and the deep n-type impurity diffusion regions 111 in this manner, the source region and the drain region can be an LDD (Lightly Doped Drain) structure.

Similarly, deep p-type impurity diffusion regions 112 aligned with the sidewalls are formed in the p-channel type MISFET formation region. A source region and a drain region are formed by the deep p-type impurity diffusion regions 112 and the shallow p-type impurity diffusion regions 109. Therefore, also in the p-channel type MISFET, the source region and the drain region have an LDD structure.

After the deep n-type impurity diffusion regions 111 and the deep p-type impurity diffusion regions 112 are formed in this manner, thermal treatment at about 1000° C. is carried out. In this manner, activation of the introduced impurities is performed.

In the first embodiment, the gate electrodes 107a and 107b are formed by polysilicon, and the source regions and the drain regions (diffusion regions) are formed by a silicon substrate; however, resistances of the gate electrodes 107a and 107b and the diffusion regions can be reduced by depositing a film of such as titanium, cobalt, and nickel on the surface and forming silicide by thermal treatment.

In this manner, the MISFETs shown in FIG. 4 can be formed on the silicon layer 102 of the SOI substrate.

Figure 5:
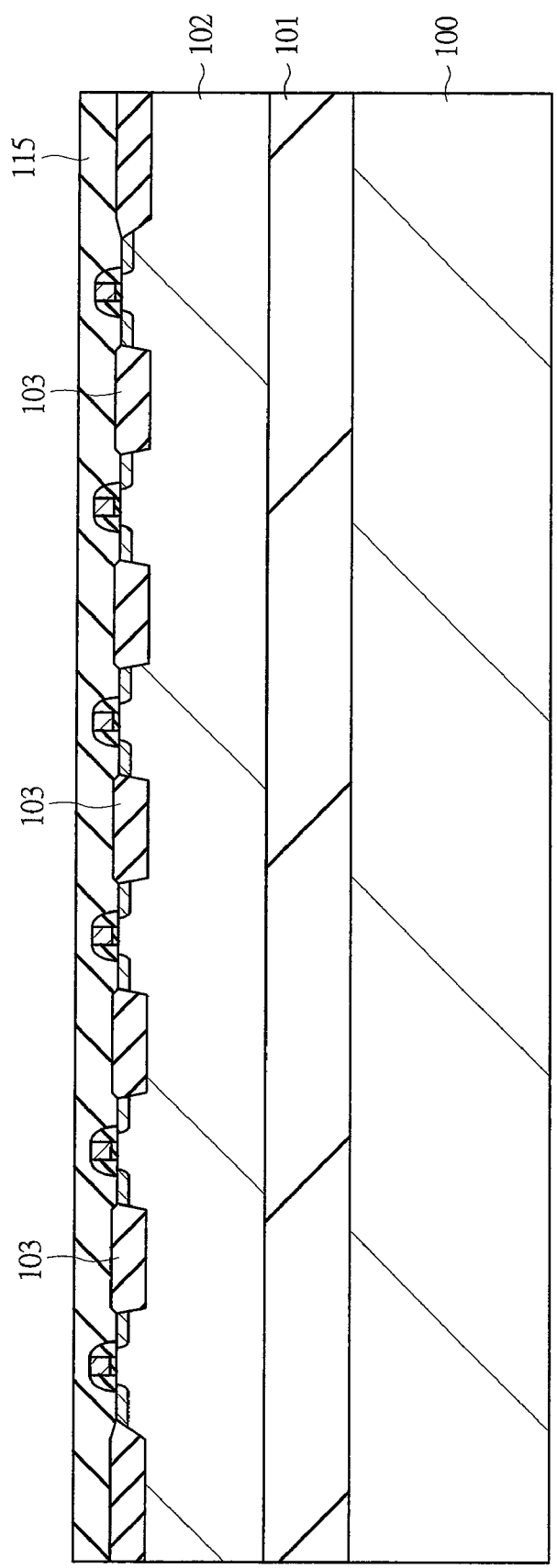
FIG. 5 is a cross-sectional view showing a manufacturing step of the semiconductor device continued from FIG. 4.

Next, as shown in FIG. 5, a silicon oxide film which will serve as an interlayer insulating film 115 is formed on the silicon layer 102 of the SOI substrate. The silicon oxide film can be formed, for example, by CVD method using TEOS (tetra ethyl ortho silicate) as a raw material. Then, the surface of the silicon oxide film is planarized, for example, by using CMP (Chemical Mechanical Polishing) method.

Figure 6:
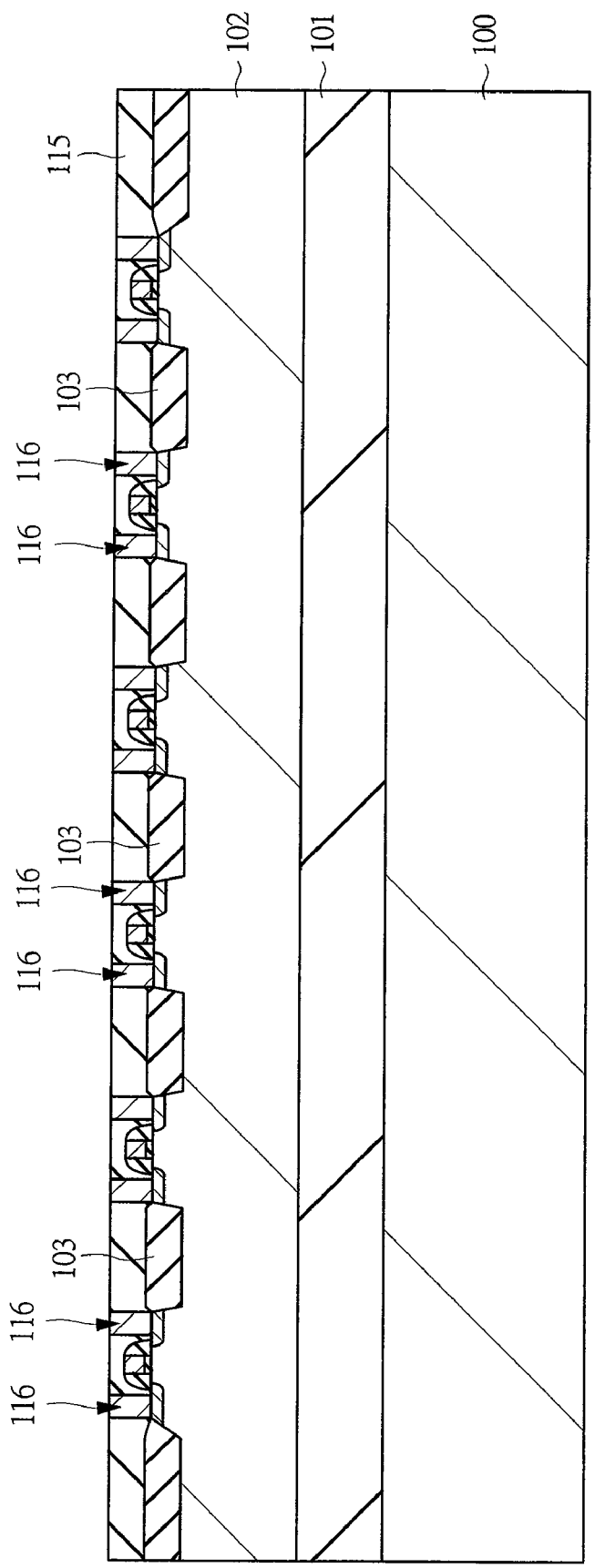
FIG. 6 is a cross-sectional view showing a manufacturing step of the semiconductor device continued from FIG. 5.

Subsequently, as shown in FIG. 6, contact holes are formed in the silicon oxide film by using photolithography technique and etching technique. Then, a titanium/titanium nitride film is formed on the silicon oxide film including the bottom surfaces and inner walls of the contact holes. The titanium/titanium nitride film is formed of a stacked film of a titanium film and a titanium nitride film and can be formed, for example, by using sputtering method. The titanium/titanium nitride film has a so-called barrier property which prevents tungsten, which is a material of a film to be buried in a later step, from diffusing into silicon.

Subsequently, a tungsten film is formed on the entire surface of the silicon oxide film, which is formed on the silicon layer 102 of the SOI substrate, so as to fill the contact holes. The tungsten film can be formed, for example, by using CVD method. Then, the unnecessary titanium/titanium nitride film and tungsten film formed on the silicon oxide film are removed, for example, by CMP method, thereby forming plugs 116.

Figure 7:
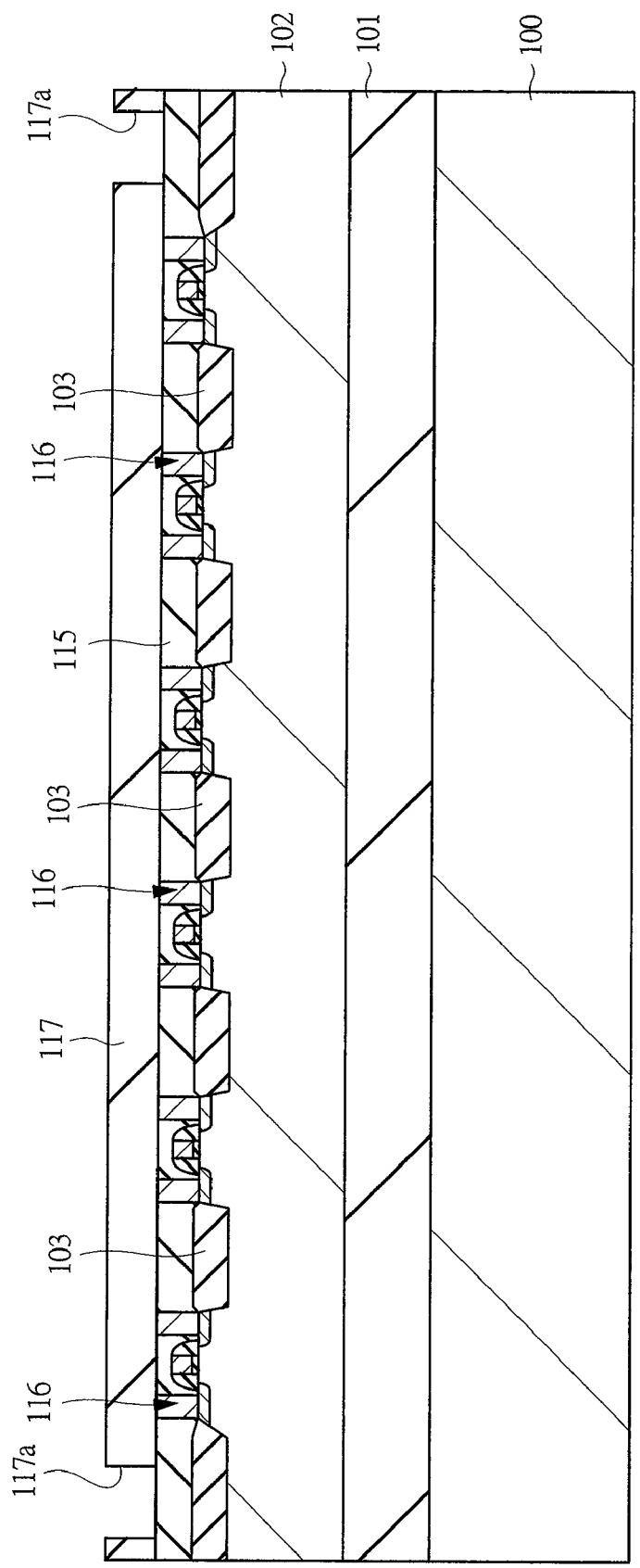
FIG. 7 is a cross-sectional view showing a manufacturing step of the semiconductor device continued from FIG. 6.

Next, as shown in FIG. 7, a resist film 117 is formed on the interlayer insulating film 115 in which the plugs 116 are formed. Then, the resist film 117 is subjected to patterning by using photolithography technique. The patterning of the resist film 117 is carried out so that opening portions 117a are formed in through-electrode formation regions.

Figure 8:
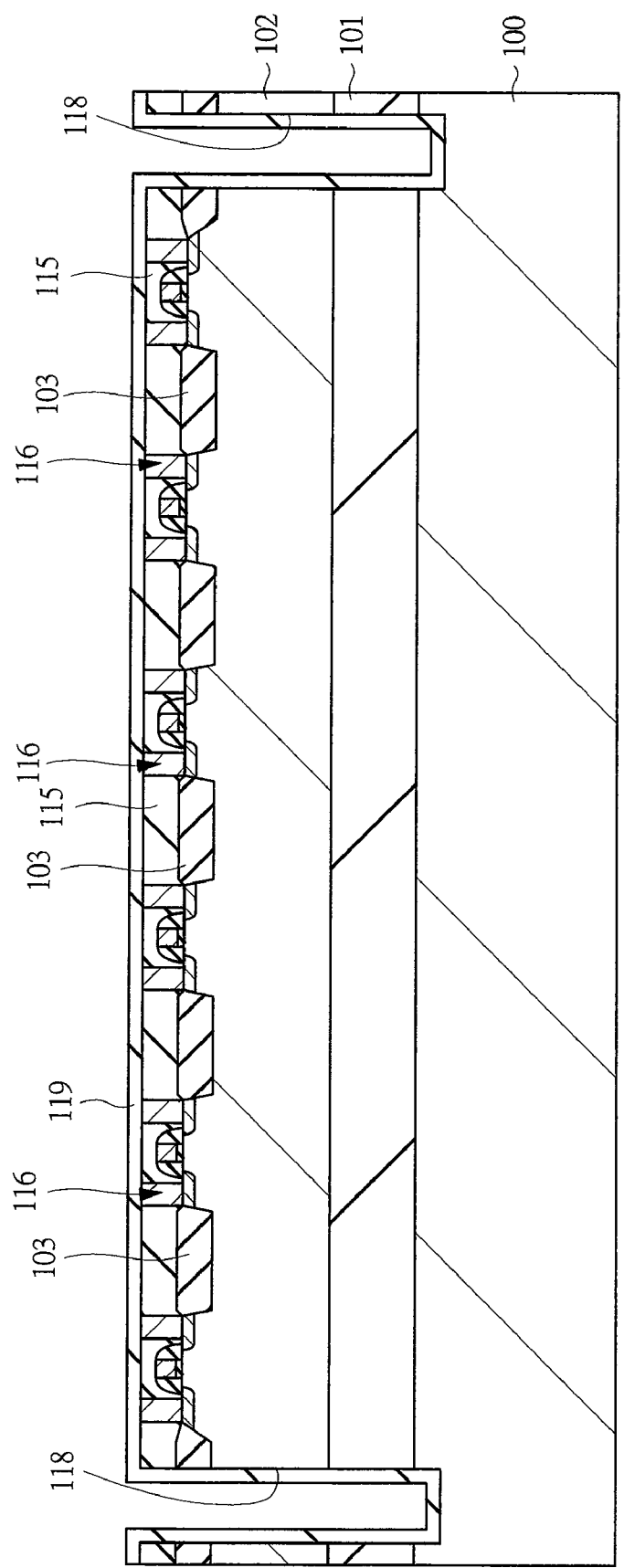
FIG. 8 is a cross-sectional view showing a manufacturing step of the semiconductor device continued from FIG. 7.

Subsequently, as shown in FIG. 8, opening portions 118 are formed by etching using the resist film 117, in which the opening portions 117a are formed, as a mask. More specifically, the interlayer insulating film 115, the isolation regions 103, the silicon layer 102, and the buried insulating layer 101 are sequentially etched at the opening portions 117a formed in the resist film 117. As a result, the opening portions 118 which reach the substrate layer 100 can be formed. Then, the resist film 117 is removed, and then the SOI substrate is cleaned. Then, a silicon oxide film 119 is formed on the interlayer insulating film 115 including the opening portions 118. The silicon oxide film 119 can be formed, for example, by plasma CVD method, and has a film thickness of about 1 μm. In this process, the silicon oxide film 119 is formed on the inner walls of the opening portions 118.

Figure 9:
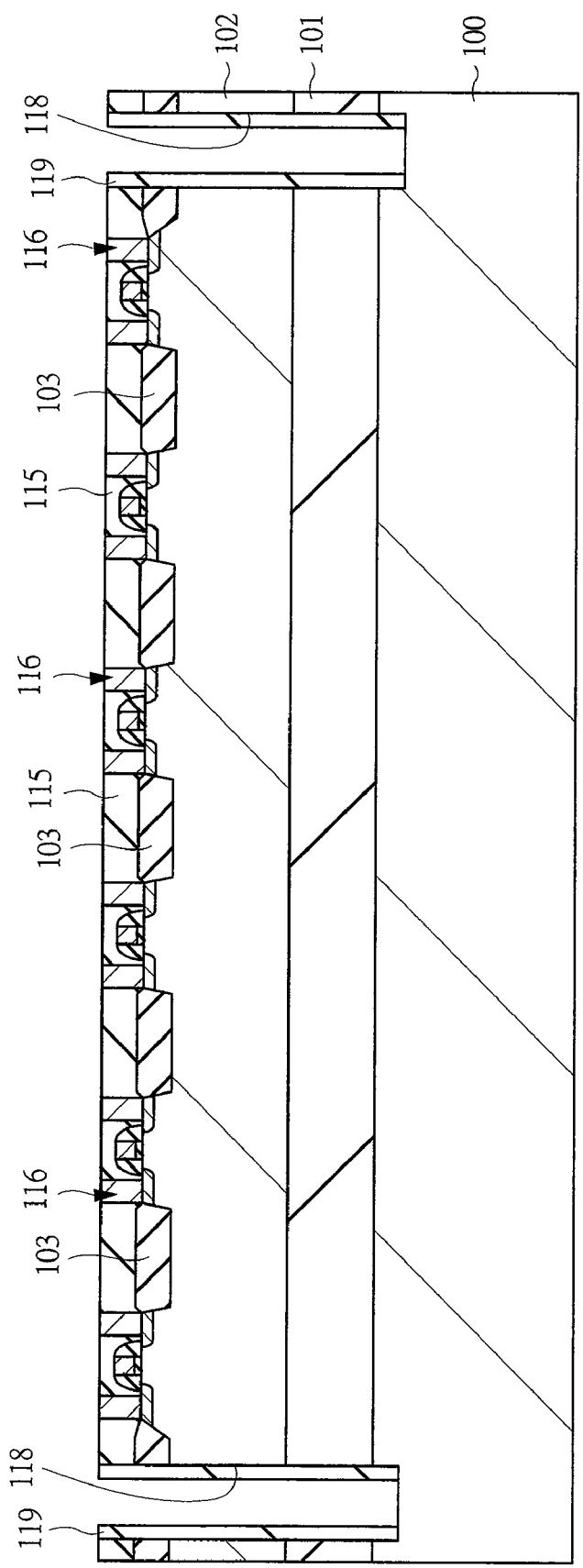
FIG. 9 is a cross-sectional view showing a manufacturing step of the semiconductor device continued from FIG. 8.

Next, as shown in FIG. 9, an etch-back process is carried out, thereby removing the silicon oxide film 119 formed on bottom portions of the opening portions 118. In the etch-back process, the silicon oxide film 119 on the interlayer insulating film 115 is also removed. However, the silicon oxide film 119 formed on the side surfaces of the opening portions 118 is remained. After the etch-back process, the SOI substrate is subjected to an ashing process and a cleaning process.

Figure 10:
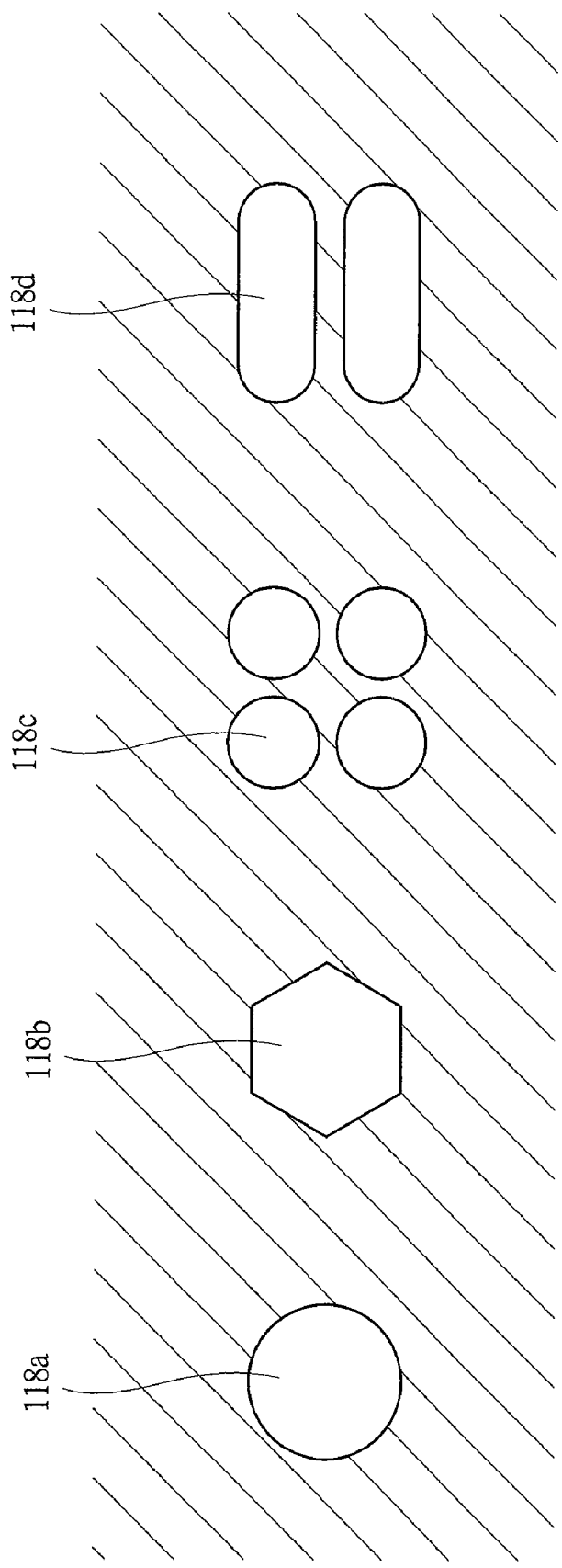
FIG. 10 is a diagram showing one example of a shape of an opening portion.

Herein, while an shape of the 118 is formed to have a circular shape 118a as shown in FIG. 10, it is not limited thereto; and, for example, a polygonal shape 118b, a plurality of circular shapes 118c, or a plurality of shapes having different vertical and lateral widths 118d may be used. The shape of the opening portion 118 is desirably selected in consideration of, for example, easiness of burying a metal film after formation of the opening portion 118, plug resistance of the through-electrode, and the parasitic capacitance between the through-electrode and the silicon layer 102 of the SOI substrate.

Figure 11:
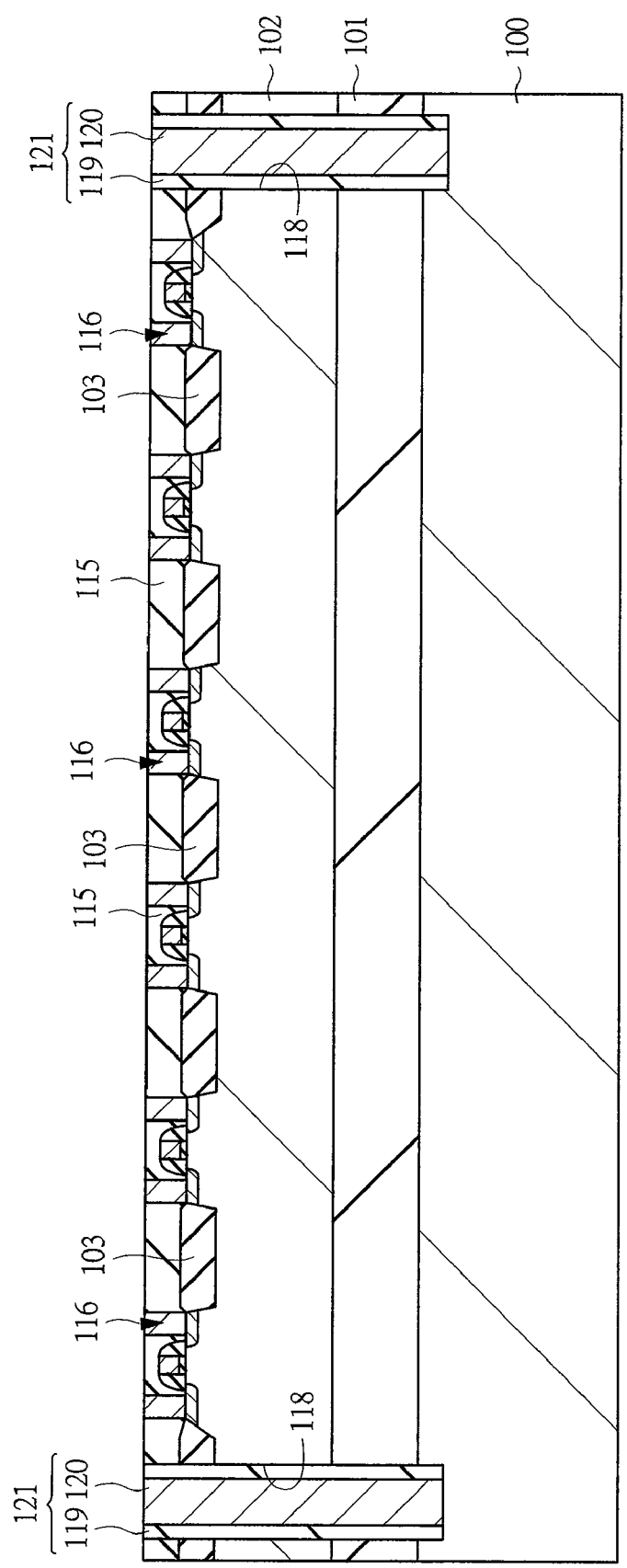
FIG. 11 is a cross-sectional view showing a manufacturing step of the semiconductor device continued from FIG. 9.

Subsequently, as shown in FIG. 11, a metal film 120 is buried in the opening portions 118, thereby forming the through-electrodes 121. Specifically, a titanium/titanium nitride film is formed on the interlayer insulating film 115 including the opening portions 118. Instead of the titanium/titanium nitride film, a tantalum/tantalum nitride film may be used. The film needs the barrier property against copper used in the first embodiment. The titanium/titanium nitride film can be formed, for example, by using sputtering method. Then, a seed layer formed of a copper film is formed on the titanium/titanium nitride film by the sputtering method. Then, a copper film is formed so as to bury the opening portions 118 by a plating method using the seed layer as an electrode. Then, after the unnecessary copper film that is formed on the interlayer insulating film 115 is removed by CMP method, the titanium/titanium nitride film exposed on the interlayer insulating film 115 is removed by using fluorine-based plasma. As a result, the titanium/titanium nitride film and the copper film are buried only in the opening portions 118. In other words, the through-electrodes 121 in which the metal film 120 formed of the titanium/titanium nitride film and the copper film is buried in the opening portions 118 can be formed. In the first embodiment, the metal film 120 is used as a conductive material that is buried in the through-electrodes 121. This is for the reason that the through-electrodes 121 are formed after formation of the MISFETs. More specifically, in the case where the through-electrodes 121 are formed before the MIS- FETs are formed, the surface of the metal film 120 buried in the through-electrodes 121 is oxidized by a thermal treatment step, etc. carried out in a step of forming the MISFETs. Consequently, it is feared that the resistance of the through-electrodes 121 may be increased, and, furthermore, it may be difficult to ensure the conductive state of the through-electrodes 121. However, in the first embodiment, the through-electrodes 121 are formed after the MISFETs are formed; therefore, the abovedescribed problems are not posed. Therefore, as the conductive material to be buried in the through-electrodes 121, the low-resistance metal film 120 such as copper can be used.

Figure 12:
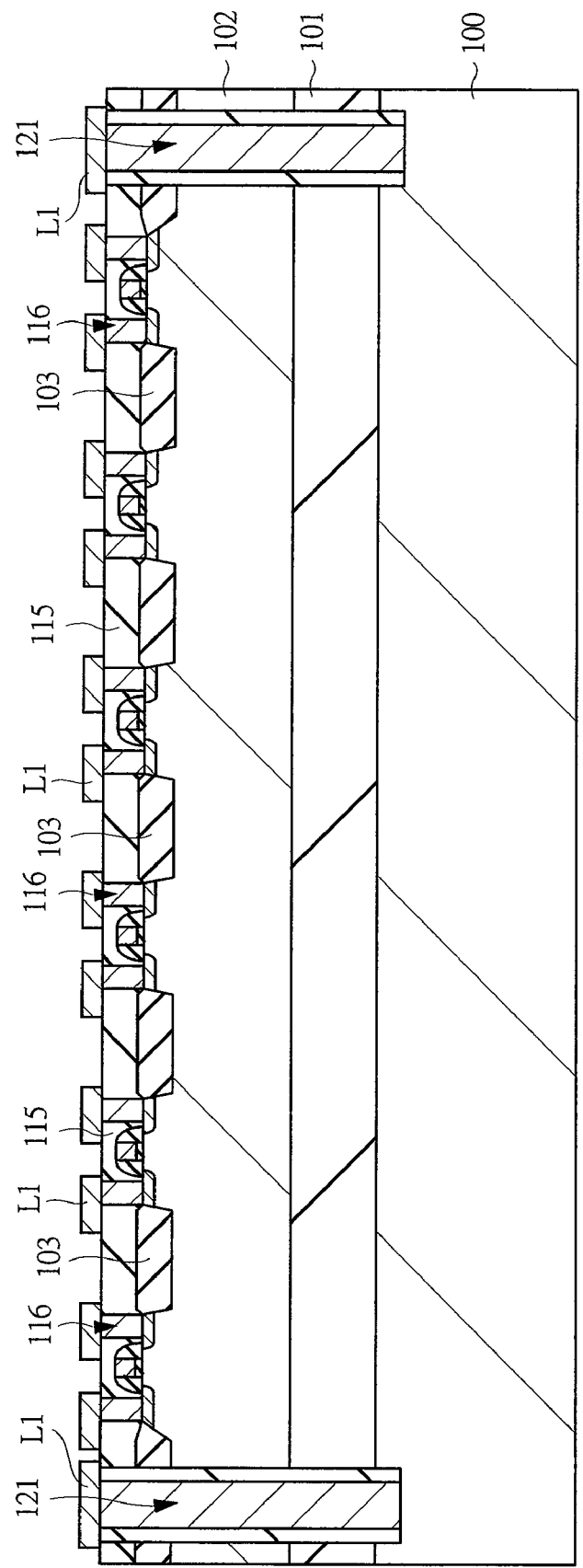
FIG. 12 is a cross-sectional view showing a manufacturing step of the semiconductor device continued from FIG. 11.

Next, as shown in FIG. 12, the first-layer wiring L1 is formed on the interlayer insulating film 115. In the first-layer wiring L1, a titanium/titanium nitride film, an aluminium film containing copper, and a titanium/titanium nitride film are sequentially formed on the interlayer insulating film 115. These films can be formed by using, for example, sputtering method. Subsequently, these films are patterned by using photolithography technique and etching technique, thereby forming the first-layer wiring L1. In this process, the first-layer wiring L1 is formed also on the through-electrodes 121.

In the first embodiment, in formation of the through-electrodes 121, after the copper film formed on the interlayer insulating film 115 is removed by the CMP method, the titanium/titanium nitride film formed on the interlayer insulating film 115 is also removed. However, the formation of the first-layer wiring L1 may be carried out in a state where the titanium/titanium nitride film formed on the interlayer insulating film 115 is remaining. In other words, it may be configured so that the titanium/titanium nitride film on the interlayer insulating film 115 that becomes unnecessary in formation of the through-electrodes 121 is used as the first-layer wiring L1.

Figure 13:
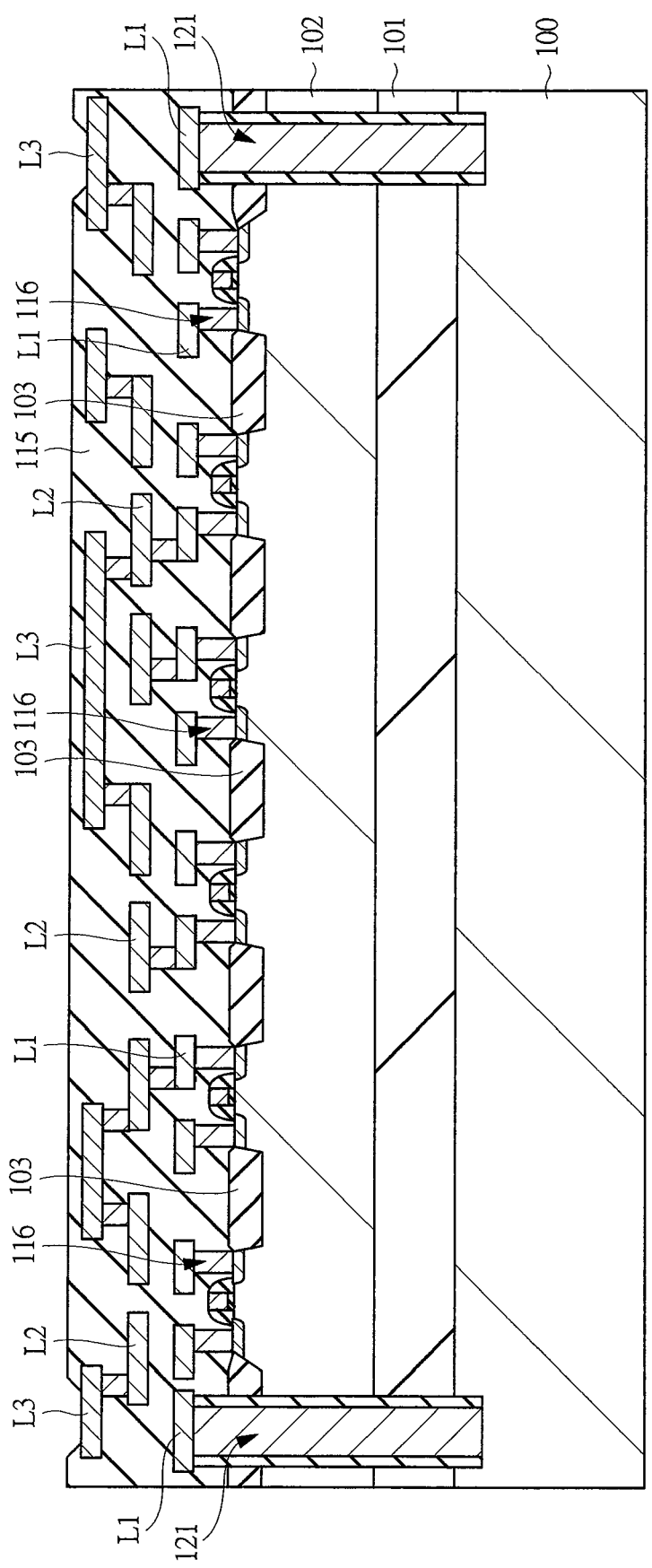
FIG. 13 is a cross-sectional view showing a manufacturing step of the semiconductor device continued from FIG. 12.

Subsequently, as shown in FIG. 13, the interlayer insulating film 115 is formed on the first-layer wiring L1, and after the interlayer insulating film 115 is planarized, plugs to be connected to the first-layer wiring L1 are formed. Then, the second-layer wiring L2 is formed so as to be connected to the plugs. Further, through similar steps, the third-layer wiring L3 is formed on the second-layer wiring L2. As well as the first-layer wiring L1, each of the second-layer wiring L2 and the third-layer wiring L3 can be formed of, for example, a stacked film of a titanium/titanium nitride film, an aluminium film, and a titanium/titanium nitride film. Then, a passivation film to serve as a surface protective film is formed on the third-layer wiring L3, and part of the third-layer wiring L3 is caused to be exposed by forming opening portions in the passivation film, thereby forming bonding pads.

In the abovedescribed manner, the integrated circuit having the MISFETs and wirings can be formed on the silicon layer 102 of the SOI substrate. The first embodiment has a feature lying in the point that the step of forming the through-electrodes is added other than a normal MISFET formation step and wiring step, where the MISFET formation step and the wiring step are carried out by normal techniques.

Figure 14:
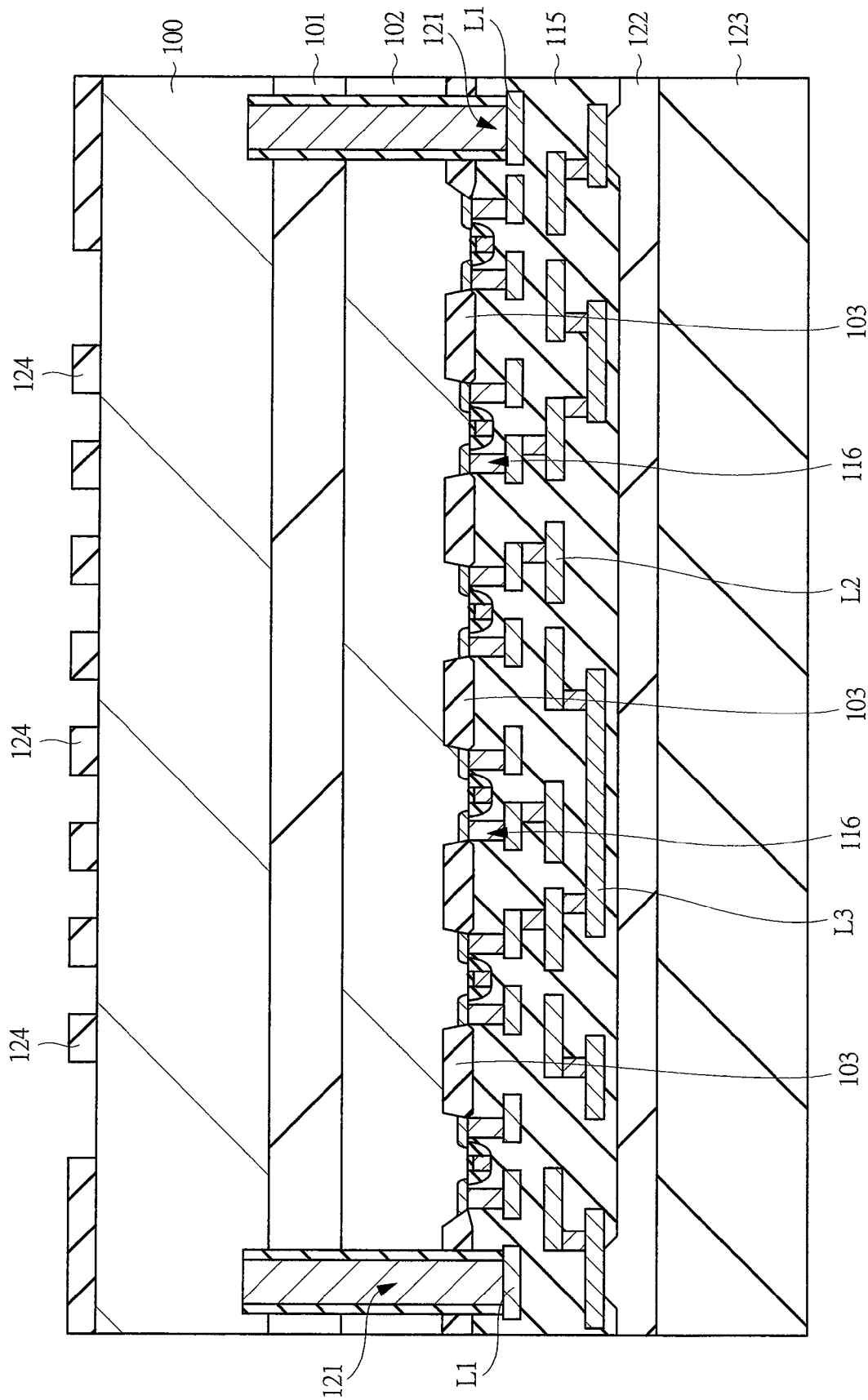
FIG. 14 is a cross-sectional view showing a manufacturing step of the semiconductor device continued from FIG. 13.

Next, a step of forming the MEMS sensor at the substrate layer 100 (back-surface side of the silicon layer 102 interposing the insulating layer 101) side of the SOI substrate will be described. First of all, as shown in FIG. 14, an adhesive layer 122 is formed on a support substrate 123, and the silicon layer 102 side of the SOI substrate is adhered to the adhesive layer 122. In other words, the SOI substrate is fixed to the support substrate 123 via the adhesive layer 122. Herein, the silicon layer 102 on which the integrated circuit is formed is positioned at the support substrate 123 (lower side) side, and the substrate layer 100 of the SOI substrate is positioned in the upper side. Then, a resist film 124 is formed on the substrate layer 100 of the SOI substrate, and the resist film 124 is patterned. The patterning is performed by etching of the substrate layer 100 using the resist film 124 as a mask so that the structure of the MEMS sensor is formed.

In the first embodiment, after the SOI substrate is caused to be adhered to the support substrate 123, the patterning onto the substrate layer 100 is performed; however, when a thickness-reduction process of the SOI wafer is carried out before the patterning onto the substrate layer 100, a thickness of the completed chip can be further reduced. It can be fabricated with adjusting the thickness of the substrate layer 100, electrode gaps of the MEMS sensor structure, etc. in accordance with the sensitivity of a detection circuit of, for example, capacity detection of the LSI circuit.

Figure 15:
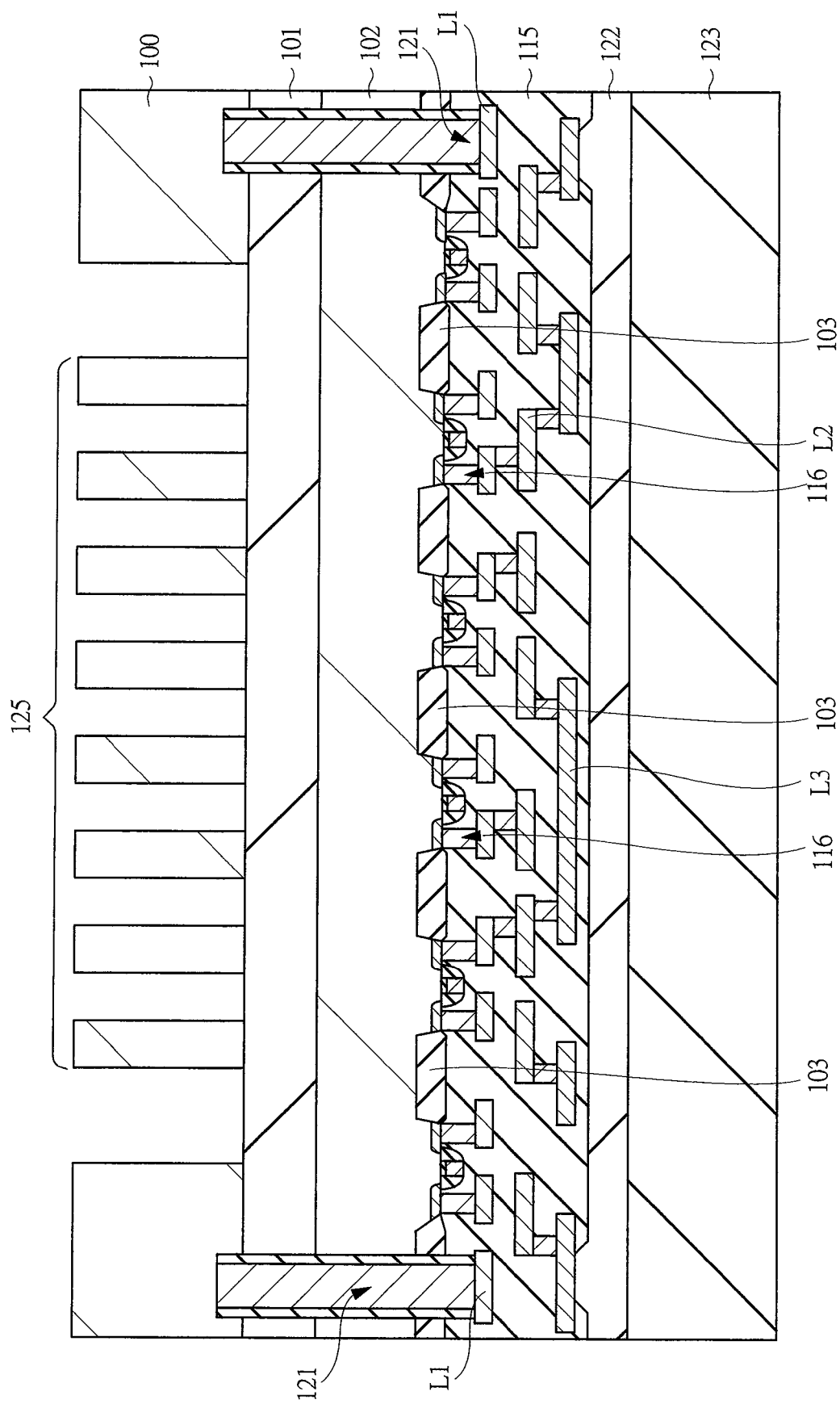
FIG. 15 is a cross-sectional view showing a manufacturing step of the semiconductor device continued from FIG. 14.

Subsequently, as shown in FIG. 15, the structure 125 of the MEMS sensor is formed in the substrate layer 100 by etching of the substrate layer 100 using the resist film 124 as a mask. The structure 125 is formed so as to include the elastically deformable beams and the mass connected to the fixing portions formed in the substrate layer 100. However, at this point, the structure 125 is fixed to the buried insulating layer 101; therefore, the structure is not in the movable state.

Figure 16:
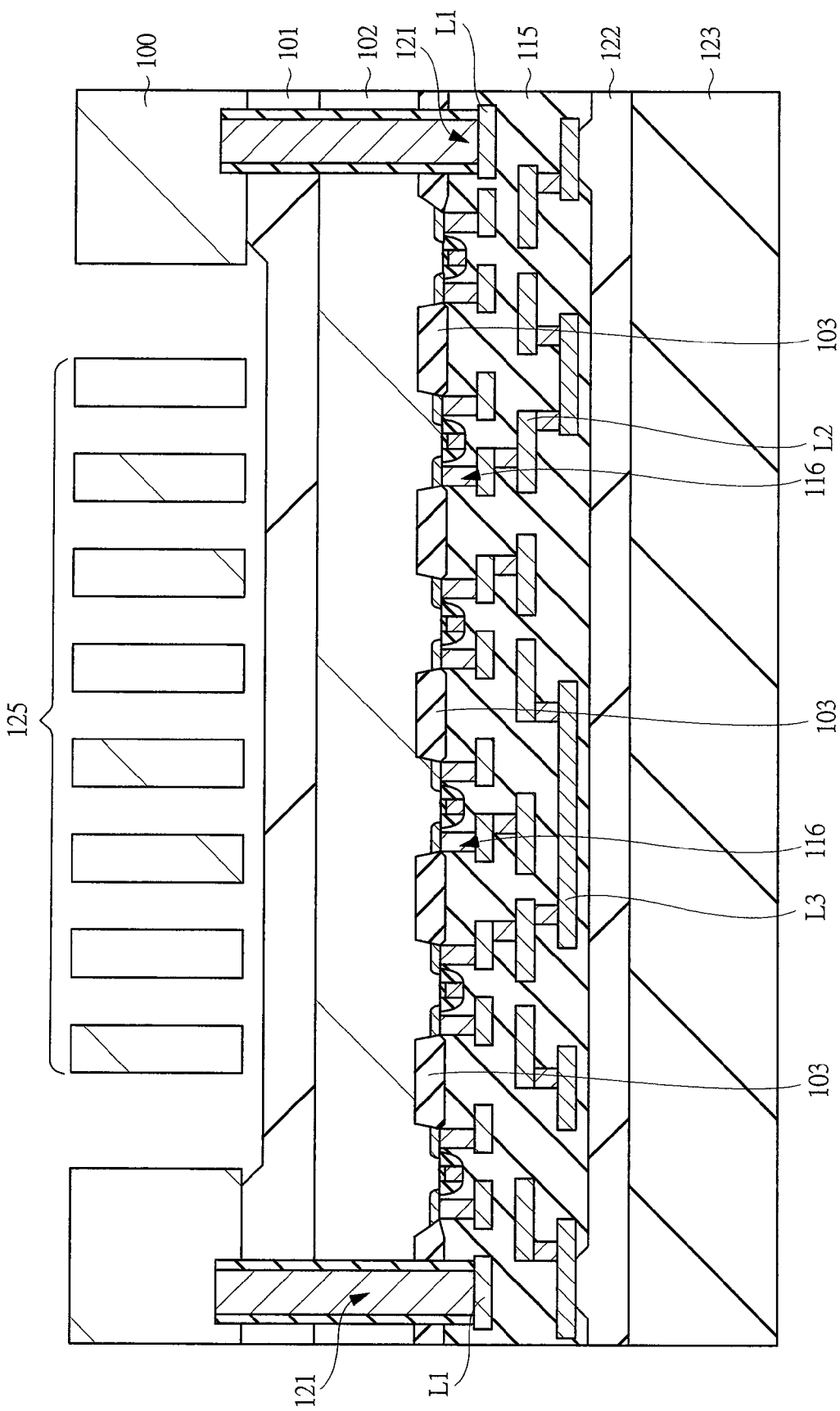
FIG. 16 is a cross-sectional view showing a manufacturing step of the semiconductor device continued from FIG. 15.

Then, the resist film 124 is removed, and the buried insulating layer 101 fixing the structure 125 is isotropically etched as shown in FIG. 16. Consequently, the structure 125 is separated from the buried insulating layer 101 and caused to be in the movable state. In FIG. 16, the example in which part of the buried insulating layer 101 is etched is shown; however, all of the buried insulating layer 101 that is present below the structure 125 may be removed. In this case, attention has to be paid so that charge-up and short-circuit malfunction do not occur between the structure 125 of the MEMS sensor and the silicon layer 102.

Figure 17:
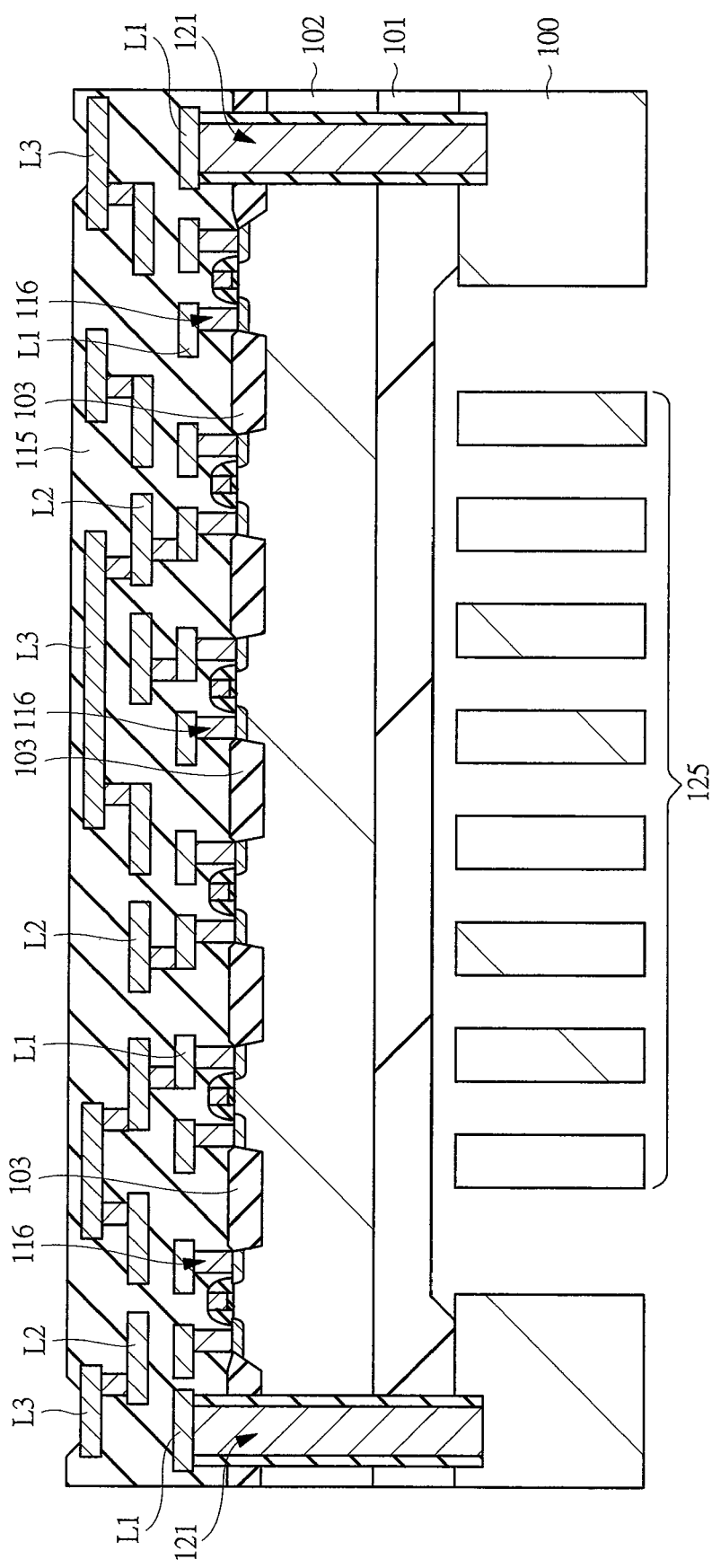
FIG. 17 is a cross-sectional view showing a manufacturing step of the semiconductor device continued from FIG. 16.

Next, as shown in FIG. 17, the support substrate 123 is exfoliated from the SOI substrate. Then, as shown in FIG. 2, the fixing portions (substrate layer 100) of the MEMS sensor and the cap 127 are bonded (metal bonding) by the metal 126, thereby hermetically sealing the structure 125 of the MEMS sensor. In the abovedescribed manner, the MEMS sensor can be formed in the substrate layer 100 of the SOI substrate. Instead of the metal bonding, a glass anodic bonding using glass as the cap material may be employed. When the glass anodic bonding is employed, a high electric field is applied via the glass; therefore, it is effective to apply a shield electrode treatment on the bonding-surface side of the glass.

In the first embodiment, the MEMS sensor is formed in the substrate layer 100 of the SOI substrate after the MISFETs and the wirings are formed on the silicon layer 102 of the SOI substrate, and it is desired to form the MEMS sensor in this manner after forming the integrated circuit first in this way. That is, the MEMS sensor is formed by processing the substrate layer 100 of the SOI substrate; therefore, when the MEMS sensor is formed before the integrated circuit, the integrated circuit is formed in a state where a plurality of holes are formed in the substrate layer 100 of the SOI substrate. Therefore, the MEMS sensor formed in the substrate layer 100 is easily damaged upon wafer shipment and processing processes. In addition, the MEMS sensor is formed in a manufacturing step at a comparatively-low temperature; therefore, even when the integrated circuit is formed first, the characteristics of the integrated circuit are not deteriorated.

In the first embodiment, the example in which the through-electrodes 121 are formed before formation of the first-layer wiring L1 constituting the integrated circuit has been described; however, the through-electrodes 121 may be formed after the first-layer wiring L1 is formed and before the second-layer wiring L2 or the third-layer wiring L3 is formed. Also in this case, the formation can be realized by a method equivalent to that of the first embodiment. Further, in the first embodiment, the three-layer wiring has been taken as an example and described as multilayered wiring constituting the integrated circuit; however, the wiring is not limited thereto, and may be a multilayered wiring having more than three layers of wirings or less wiring layers.

According to the first embodiment, in the SOI substrate having the substrate layer 100, the buried insulating layer 101 buried in the substrate layer 100, and the silicon layer 102 formed on the buried insulating layer 101, the integrated circuit is formed on the silicon layer 102, and, on the other hand, the MEMS sensor can be formed by processing the substrate layer 100. In other words, the integrated circuit is formed on one surface of the SOI substrate, and the MEMS sensor is formed on the other surface thereof, thereby realizing downsizing and thickness reduction compared with the case where the MEMS sensor and the integrated circuit are formed on different semiconductor chips.

In addition, the integrated circuit formed on the silicon layer 102 and the MEMS sensor formed in the substrate layer 100 are configured to be directly connected by the through-electrodes 121 penetrating through the buried insulating layer 101. Therefore, in the configuration in which the integrated circuit and the MEMS sensor are directly connected by the through-electrodes 121, the parasitic capacitance fluctuations can be suppressed, and the sensitivity and the detection accuracy of the MEMS sensor can be improved, although parasitic capacitance fluctuation between wires are generated in the case where the integrated circuit and the MEMS sensor are connected by wire bonding. As described above, downsizing and thickness reduction of the semiconductor device and improvement of sensitivity and detection accuracy can be both achieved by forming the MEMS sensor and the integrated circuit on the same SOI substrate and electrically connecting the MEMS sensor and the integrated circuit by the through-electrodes 121 penetrating through the buried insulating layer 101.

Furthermore, also in the case where the structure constituting the MEMS sensor is hermetically sealed, external draw-out electrodes can be formed in the side on which the integrated circuit is formed; therefore, there is no need to form opening portions in the cap, which hermetically seals the structure, and form the external draw-out electrodes. Therefore, steps of hermetically sealing the structure constituting the MEMS sensor can be simplified, and also reliability of the bonding surface of the cap and the MEMS sensor can be improved.

Second Embodiment

In a second embodiment, an example of using a substrate in which a plurality of buried insulating layers are formed as an SOI substrate will be described. The second embodiment is different from the abovedescribed first embodiment in a point that the SOI substrate in which the plurality of buried insulating layers are formed is used and a point that a plurality of through-electrodes having different connection destinations are formed in the SOI substrate.

First of all, a MEMS sensor of the second embodiment is an angular rate sensor. A configuration of the angular rate sensor will be described with reference to FIG. 18.

Figure 18:
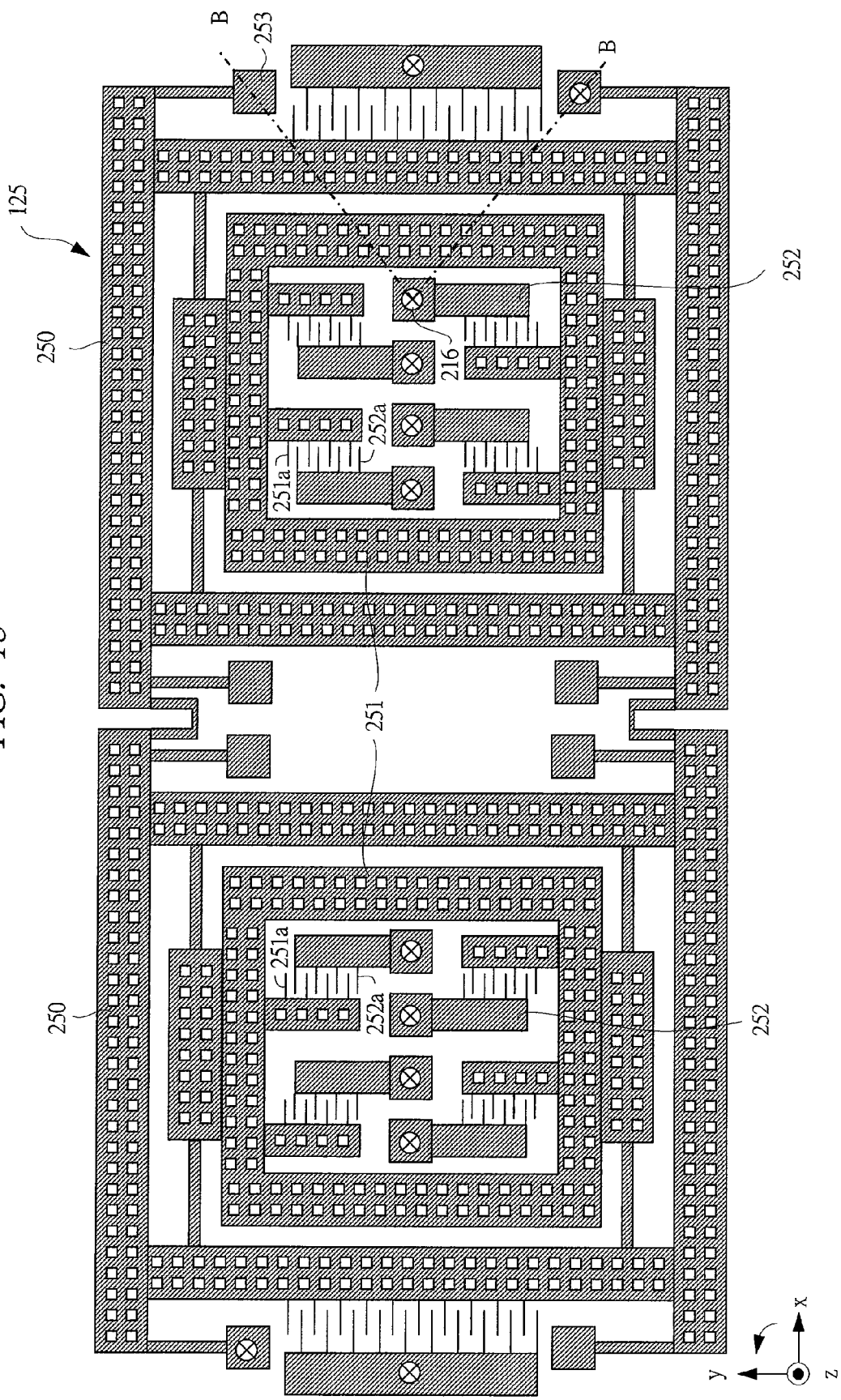
FIG. 18 is a plan view showing a configuration of a MEMS sensor according to a second embodiment.

FIG. 18 is a plan view showing the configuration of the angular rate sensor which is the MEMS sensor. In FIG. 18, the angular rate sensor of the second embodiment has fixing portions 253 formed on the SOI substrate and the structure 125 to be connected to the fixing portions 253. The structure 125 has movable masses 250 and 251 and detection portions 252.

The outside movable masses 250 are connected to the fixing portions 253 via elastically deformable beams, and the inside movable masses 251 are connected to the outside movable masses 250 via elastically deformable beams. The fixing portions 253 and the movable masses 250 and 251 are formed by processing conductive silicon, mutually mechanically connected, and, in addition, mutually electrically connected. More specifically, the movable masses 250 are configured so as to be able to vibrate in an x direction, and the inside movable masses 251 also vibrate in the x direction together with the movable masses 250. Furthermore, the inside movable masses 251 can be displaced also in a y direction.

The movable masses 250 and 251 have a rectangular shape in which the interior thereof is hollow, and the detection portions 252 is formed in the movable mass 251. More specifically, the detection portions 252 are formed inside the movable mass 250 and 251 having a dual hollow square shape. In the movable mass 251, movable electrodes 251a connected to the movable mass 251 and fixed electrodes 252a connected to the detection portions 252 are arranged, and detection capacitor elements are formed by the movable electrodes 251a and the fixed electrodes 252a.

The movable electrodes 251a formed to the inside movable mass 251 are electrically connected to the beams connected to the inside movable mass 251, the outside movable mass 250, the beams connected to the outside movable mass 250, and the fixing portions 253, and are indirectly connected to through-electrodes 216 connected to the fixing portions 253. On the other hand, the fixed electrodes 252a formed to the detection portions 252 are connected to the through-electrodes 216 which reach the detection portions 252. Therefore, input/output of the detection capacitor elements can be controlled by the through-electrodes 216 connected to the fixing portions 253 and the through-electrodes 216 connected to the detection portions 252.

The MEMS sensor (angular rate sensor) of the second embodiment is configured in the abovedescribed manner, and the operations thereof will be described below. As shown in FIG. 18, first, the movable masses 250 and 251 are caused to undergo normal vibrations in the x direction. When a rotation about a z axis is generated, the inside movable masses 251 are displaced in the y direction by Coriolis force. When the inside movable masses 251 are displaced in the y direction, a distances between the movable electrode 251a connected to the movable mass 251 and the fixed electrode 252a connected to the detection portion 252 is changed. Therefore, the capacitance of the capacitor element configured by the movable electrodes 251a and the fixed electrodes 252a is changed. The capacitance change is electrically detected by an integrated circuit via the through-electrodes 216, thereby detecting an angular acceleration.

For simplicity, FIG. 18 merely shows the movable masses 250 and 251, the fixed electrodes 252a and the movable electrodes 251a for Coriolis force detection, the fixing portions 253, and electrodes arranged on the left and the right for applying vibrations; however, it goes without saying that monitor electrodes for detecting the applied vibrations in the x direction, various adjustment electrodes, electrodes for detecting the Coriolis force by canceling it out by a servo force by the zero method, etc. may be added.

While the MEMS sensor (angular rate sensor) formed in this manner is formed in the SOI substrate, further, the integrated circuit (LSI) is also formed on the SOI substrate. A manner how the MEMS sensor and the integrated circuit are formed on the SOI substrate will be described by using a cross-sectional view.

Figure 19:
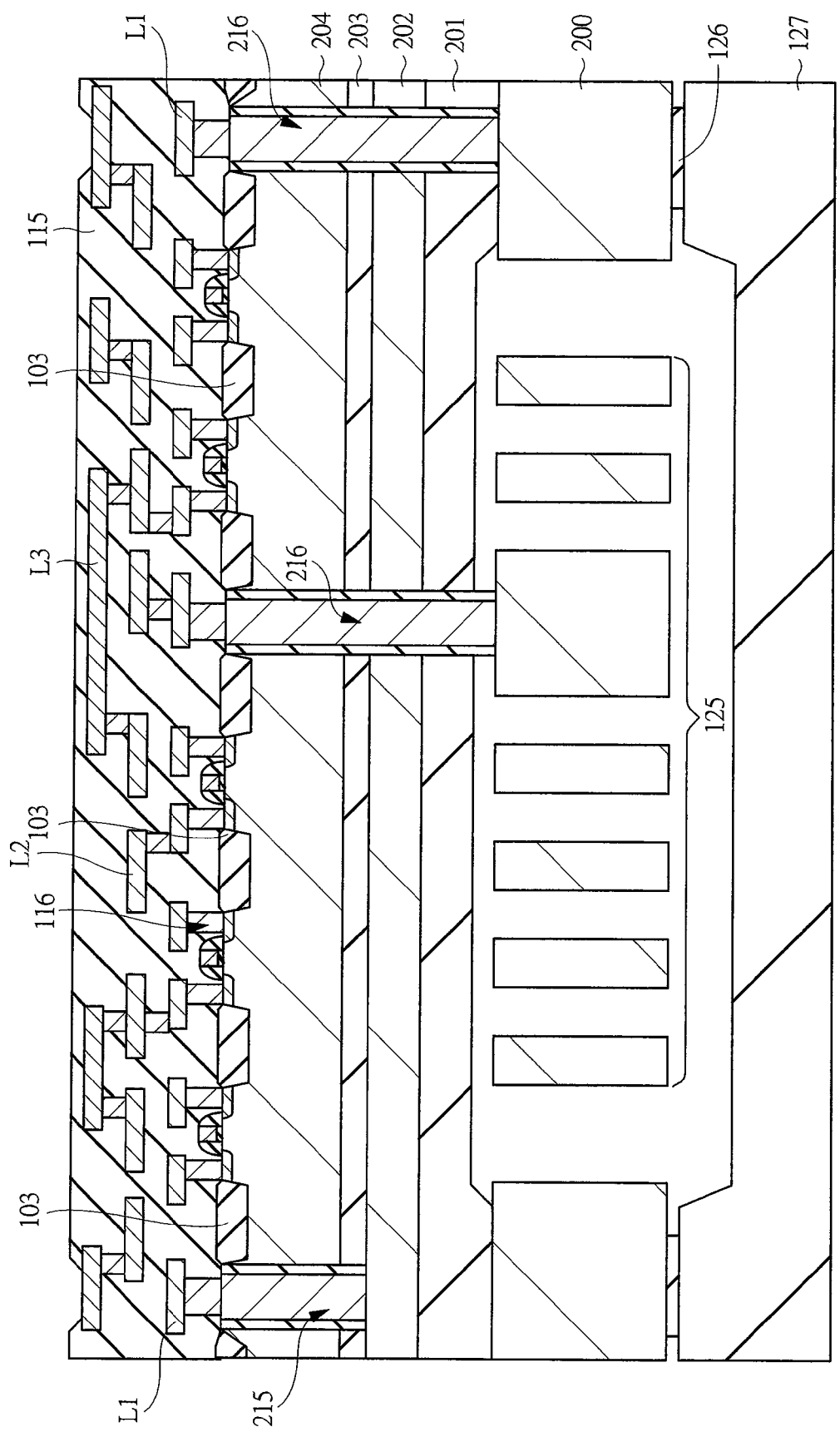
FIG. 19 is a cross-sectional view showing a configuration of a semiconductor device according to the second embodiment.

FIG. 19 is a cross-sectional view showing the configuration of a semiconductor device of the second embodiment and is showing a cross section taken along the line B-B of FIG. 18. In FIG. 19, in the semiconductor device of the second embodiment, the integrated circuit comprising MISFETs and wirings is formed on one surface of the SOI substrate. The MISFETs formed on the SOI substrate are formed in active regions divided by the isolation regions 103 and have a similar configuration as the abovedescribed first embodiment. As same with the abovedescribed first embodiment, the interlayer insulating film 115 formed by, for example, a silicon oxide film is formed on the MISFETs, and multilayered wirings are formed in the interlayer insulating film 115. As an example of the multilayered wirings, FIG. 19 shows the first-layer wiring L1, the second-layer wiring L2 formed on the first-layer wiring L1, and the third-layer wiring L3 formed on the second-layer wiring L2. The first-layer wirings L1 are directly connected to the MISFETs via the plugs 116. In FIG. 19, the third-layer wiring L3 is the uppermost-layer wiring, and part of the third-layer wiring L3 serves as bonding pads. The bonding pads are exposed from the interlayer insulating film 115 and configured to be connected to external wirings (external terminals), for example, via wires. In the abovedescribed manner, the integrated circuit having the MISFETs and the wirings is formed on one surface of the SOI substrate.

On the other hand, the MEMS sensor is formed on the other surface of the SOI substrate. More specifically, the fixing portions and the structure 125 that is able to be displaced constituting the MEMS sensor are formed by processing a substrate layer 200 constituting the SOI substrate. The structure 125 is configured by, for example, the elastically deformable beams and the masses. More specifically, same as the abovedescribed first embodiment, in the MEMS sensor, the fixing portions and the masses are connected by the beams and configured so that the masses can be moved when external force is applied to the MEMS sensor. The structure 125 of the MEMS sensor is hermetically sealed by the cap 127. The sealing by the cap 127 is carried out, for example, by metal bonding by the metal 126. In this manner, the integrated circuit and the MEMS sensor are formed on both surfaces of the SOI substrate in the second embodiment.

The configuration until here is similar to that of the abovedescribed first embodiment, and next, a configuration different from the abovedescribed first embodiment will be described. First, the second embodiment is different from the abovedescribed first embodiment in a point of the configuration of the SOI substrate. As shown in FIG. 19, the SOI substrate of the second embodiment has the substrate layer 200, a first buried insulating film 201 formed on the substrate layer 200, and an intermediate layer 202 formed on the first buried insulating layer 201. Further, the SOI substrate has a second buried insulating layer 203 formed on the intermediate layer 202, and a silicon layer 204 formed on the second buried insulating layer 203. The integrated circuit having the MISFETs and the wirings is formed on the silicon layer 204 of the SOI substrate configured in this manner, and the MEMS sensor including the structure 125 is formed in the substrate layer 200.

The substrate layer 200 is formed of, for example, single-crystal silicon and has a film thickness of about 300 μm. The first buried insulating layer 201 is formed by, for example, a silicon oxide film and has a film thickness of about 5 μm. Further, the intermediate layer 202 is formed of, for example, silicon and has a film thickness of about 40 μm. The second buried insulating layer 203 is formed by, for example, a silicon oxide film and has a film thickness of about 1 μm. And, the silicon layer 204 is formed of, for example, silicon and has a film thickness of about 50 μm.

Next, a point of the second embodiment different from the abovedescribed first embodiment is the types of the through-electrodes. In the second embodiment, for example, as shown in FIG. 19, a through-electrode 215 which connects the first-layer wiring L1 constituting the integrated circuit and the intermediate layer 202 of the SOI substrate, and through-electrodes 216 which connect the first-layer wiring L1 and the substrate layer 200 (substrate layer 200 in which the MEMS sensor is formed) of the SOI substrate are formed. In other words, in the second embodiment, the plurality of through-electrodes having different connection destinations are formed. By providing the through-electrodes 216 connecting the integrated circuit and the MEMS sensor and the through-electrode 215 connecting the integrated circuit and the intermediate layer 202 of the SOI substrate in this manner, various types of connection relations can be built. More specifically, the intermediate layer 202 of the SOI substrate can be also caused to function as part of the wirings, and the flexibility of electrical connections of the integrated circuit and the MEMS sensor can be improved. For example, in the angular rate sensor which is the MEMS sensor, since the angular rate is detected by using the capacitance variations of the movable masses, it is desired to stabilize the electric potentials between the movable masses and the SOI substrate and to suppress parasitic capacitance fluctuations from the viewpoint of improving the detection sensitivity. Therefore, in order to stabilize the electric potentials of the movable masses and the intermediate layer that serves as a substrate, by making the intermediate layer 202 of the SOI substrate have the same electric potential as the movable masses, and electrically connecting the integrated circuit and the intermediate layer 202 of the SOI substrate, the intermediate layer 202 can be stabilized to a constant electric potential.

Further, according to the second embodiment, since the MEMS sensor and the integrated circuit are connected by the through-electrodes 215 and 216, there is an advantage that the draw-out wiring from the capacitor elements formed in the MEMS sensor can be simplified. For example, the structure 125 constituting the MEMS sensor is formed by processing the substrate layer 200 of the SOI substrate. Since the substrate layer 200 has a single-layer structure, in formation of the structure 125, the draw-out wiring from the capacitor elements formed in the structure 125 is also necessary to be formed by the substrate layer 200. Therefore, arrangement of the draw-out wiring has to be taken into consideration in formation of the structure 125; therefore, this is a restriction in terms of layout of the MEMS sensor. However, according to the second embodiment, input/output of the capacitor elements can be drawn out to the outside by the through-electrodes 215 and 216 connected to the structure 125; therefore, the flexibility of the layout configuration of the MEMS sensor is improved. More specifically, it is not necessary to form the drawn wiring by the substrate layer 200, and the wirings of the integrated circuit which is the connection destination of the through-electrodes 215 and 216 can be used; therefore, the flexibility of layout in the substrate layer 200 which forms the MEMS sensor is improved.

Specifically, a layout as described below can be implemented in the second embodiment. As shown in FIG. 18, the movable masses 250 and 251 have the dual hollow square shape, and the detection portions 252 are formed in the interior thereof. Therefore, if the through-electrodes 216 connected to the detection portions 252 are not formed, drawn wirings has to be formed on the substrate layer 200 in order to achieve connections between the detection portions 252 and an external circuit. In this case, the shape of the movable mass 251 cannot be the hollow square shape. This is for the reason that the drawn wirings are necessary to be formed from the interior of the movable mass 251 toward the outside in order to ensure input/output between the detection portions 252 and the external circuit. More specifically, if the movable mass 251 has a complete hollow square shape, the draw-out wiring from the detection portions 252 cannot be formed since the movable mass 251 and the detection portions 252 are formed by processing the same single-layer substrate layer 200. Therefore, for example, the shapes of the movable masses 250 and 251 are caused to be a U-like shape so as to form the draw-out wiring from the detection portions 252 to the external circuit.

In this case, the rigidity of the movable mass 251 is conceivably weakened. Thus, from the viewpoint of enhancing the rigidity, the movable mass 251 is desired to have the symmetrical hollow square shape rather than the asymmetrical U-like shape. If the rigidity of the movable mass 251 is weakened, for example when normal vibrations in the x direction are being made, it is feared that vibrations of an unnecessary mode may be generated so that the sensitivity of the MEMS sensor is deteriorated. Therefore, in the structure in which the draw-out wiring is drawn, not only the flexibility of layout of the MEMS sensor is deteriorated, but also a detriment is generated in an improvement of the performance of the MEMS sensor.

On the other hand, in the case where the electrical connections between the detection portions 252 and the external circuit are achieved by using the through-electrodes 216 like the second embodiment, it becomes unnecessary to form the drawn wiring by the substrate layer 200 forming the MEMS sensor. Therefore, even when the movable masses 250 and 251 have the hollow square shapes, the electrical connections from the detection portions 252 disposed in the movable mass 251 to the external circuit can be realized. Therefore, in the second embodiment, the flexibility of layout of the structure 125 constituting the MEMS sensor can be improved, and also the performance of the MEMS sensor can be improved.

Further, in the case where the draw-out wiring is formed in the substrate layer 200, due to the restriction in terms of layout, a plurality of external terminals have to be provided for the wirings that supply signals of a same electric potential (same signals). More specifically, it is conceived that, even the wirings transmit the same signals, in many cases, the wirings cannot be drawn to share the wirings that transmit the same signal due to differences in, for example, the arrangement positions of the capacitor elements (restriction of layout). Therefore, even when the wirings supply same signals, a plurality of external terminals are provided, and then wirings to be connected to the detection capacitor elements are formed therefrom. However, in the second embodiment, the MEMS sensor and the integrated circuit are connected to each other by the through-electrodes 215 and 216; therefore, it is possible to configure such that the detection capacitor elements can be connected to the wiring layer of the integrated circuit by the through-electrodes 215 and 216 so as to share the wirings that transmit the same signals by the wiring layers of the integrated circuit. Therefore, the number of the external terminals for the connection from the integrated circuit to the external circuit can be reduced, and downsizing of the semiconductor device can be promoted.

The semiconductor device of the second embodiment is configured in the abovedescribed manner, and a method of manufacturing the same will be described in the following. In the abovedescribed first embodiment, the example of forming the through-electrodes after forming the MISFET has been described; however, in the second embodiment, an example in which the through-electrodes are formed before the MISFETs will be described.

Figure 20:
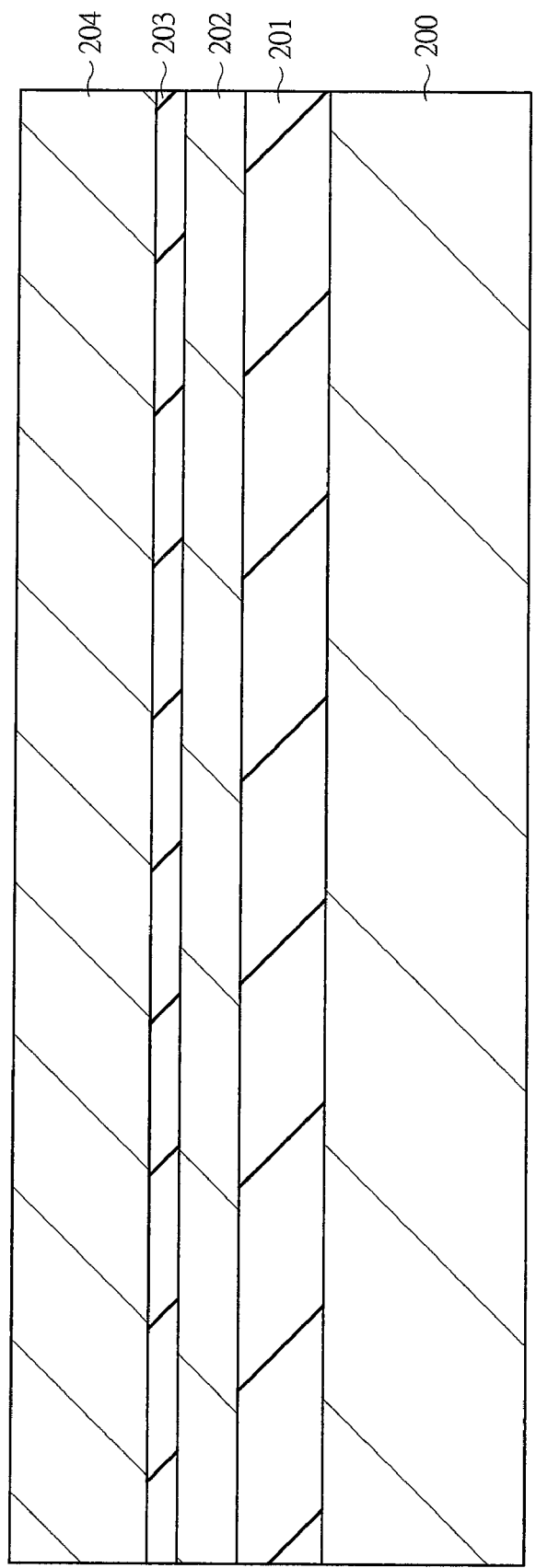
FIG. 20 is a cross-sectional view showing a manufacturing step of the semiconductor device according to the second embodiment.

First of all, as shown in FIG. 20, the SOI substrate is prepared. The SOI substrate has the substrate layer 200, the first buried insulating layer 201 formed on the substrate layer 200, the intermediate layer 202 formed on the first buried insulating layer 201, the second buried insulating layer 203 formed on the intermediate layer 202, and the silicon layer 204 formed on the second buried insulating layer 203. The substrate layer 200, the intermediate layer 202, and the silicon layer 204 are formed of, for example, silicon, and the first buried insulating layer 201 and the second buried insulating layer 203 are formed by, for example, silicon oxide films.

Figure 21:
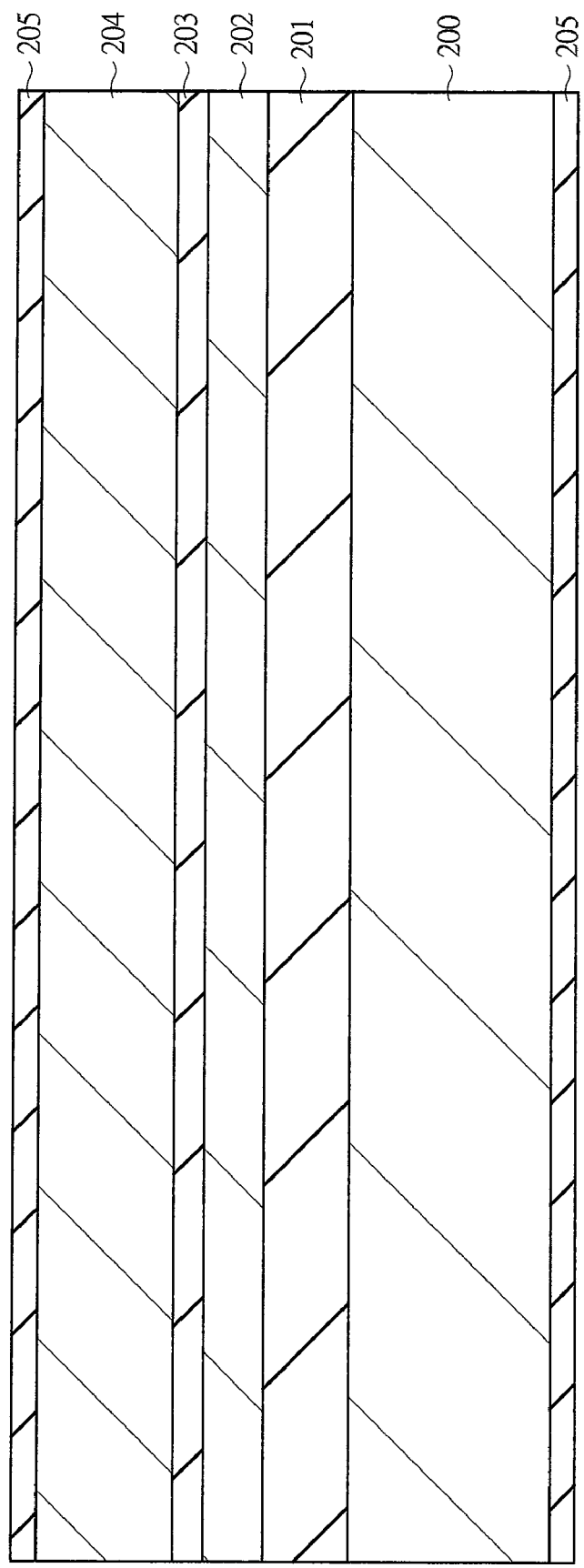
FIG. 21 is a cross-sectional view showing a manufacturing step of the semiconductor device continued from FIG. 20.

Next, as shown in FIG. 21, after both surfaces of the SOI substrate are oxidized by about 10 nm, silicon nitride films 205 are formed on the both surfaces of the SOI substrate. The silicon nitride films 205 can be formed by using CVD method, and the film thickness thereof is, for example, about 300 nm.

Figure 22:
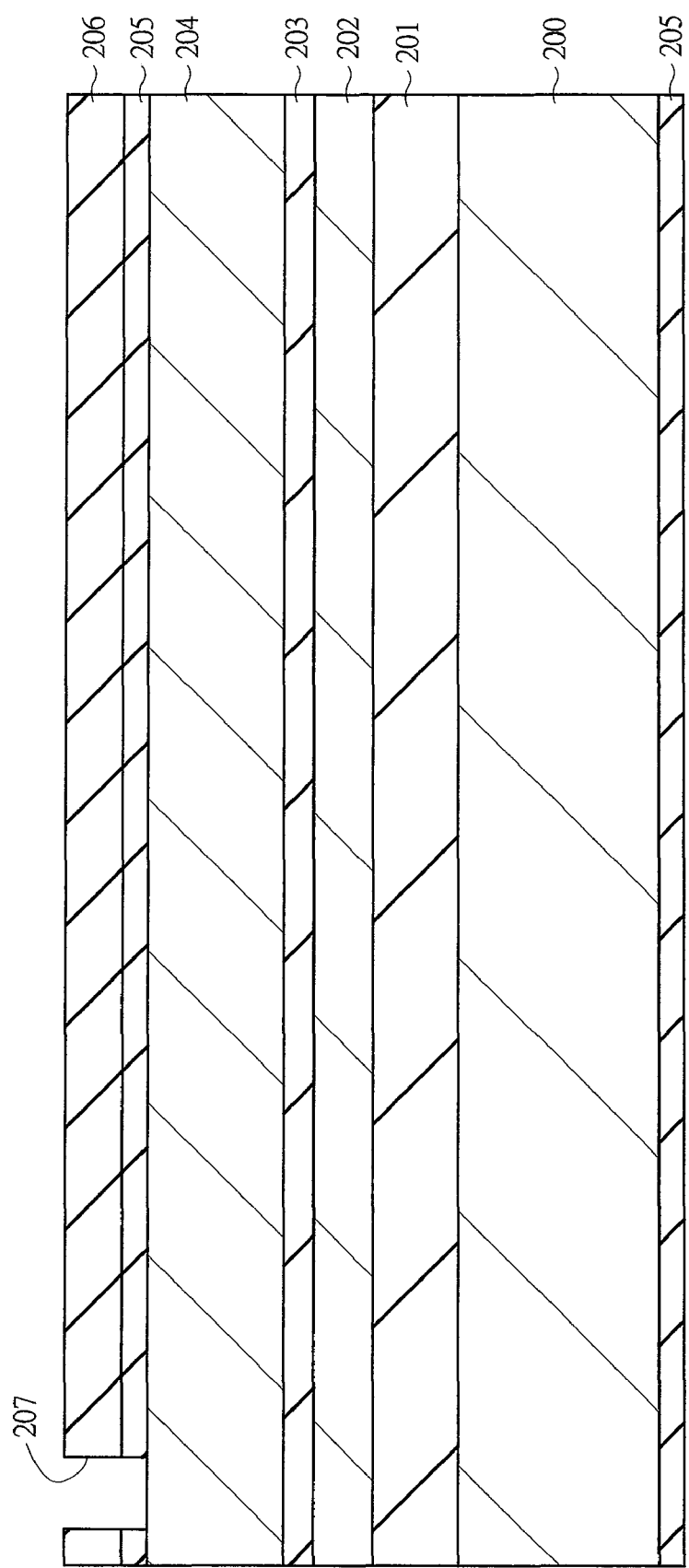
FIG. 22 is a cross-sectional view showing a manufacturing step of the semiconductor device continued from FIG. 21.

Subsequently, as shown in FIG. 22, a resist film 206 is formed on the silicon nitride film 205 that is formed on the silicon layer 204 of the SOI substrate. Then, the resist film 206 is subjected to patterning by using photolithography technique. The patterning of the resist film 206 is performed so as to form an opening portion 207 in a through-electrode formation region. Then, the silicon nitride film 205 exposed from the opening portion 207 is etched.

Figure 23:
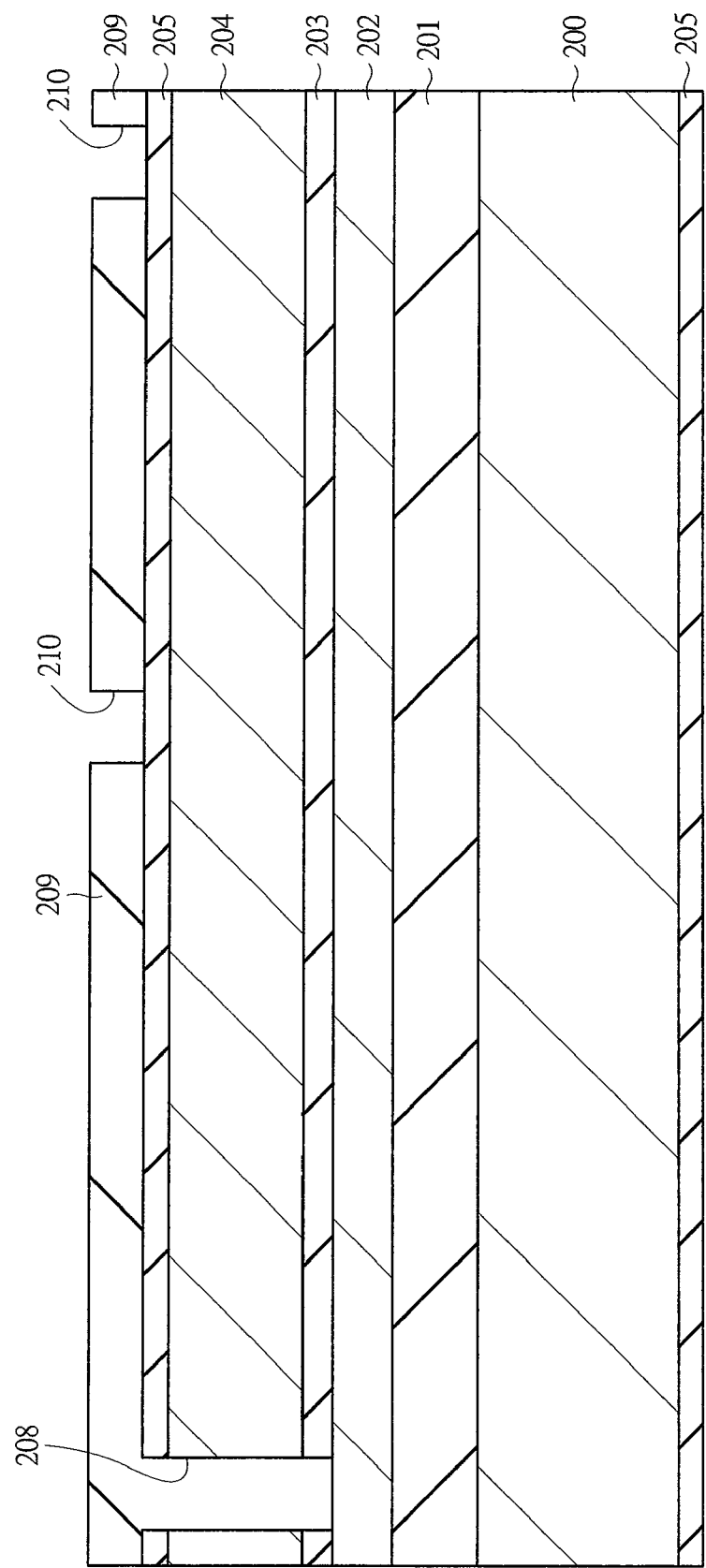
FIG. 23 is a cross-sectional view showing a manufacturing step of the semiconductor device continued from FIG. 22.

After that, as shown in FIG. 23, the silicon layer 204 and the second buried insulating film 203 are etched by using the patterned resist film 206 as a mask. In this manner, an opening portion 208 which penetrates through the silicon layer 204 and the second buried insulating film 203 of the SOI substrate and reaches the intermediate layer 202 can be formed. Then, after the patterned resist film 206 is removed, a resist film 209 is applied again. At this time, the resist film 209 is also buried in the inside of the opening portion 208. Therefore, if there is generated a distribution in the film thickness of the resist film 209, the flatness of the resist film 209 can be ensured by applying the resist film 209 twice or applying the resist film 209 again after subjecting the once-applied resist film 209 to etch back.

Next, by using photolithography technique, the resist film 209 is patterned. The patterning of the resist film 209 is performed so as to provide opening portions 210 in the regions where the through-electrodes that reach the substrate layer 200 of the SOI substrate are to be formed.

Figure 24:
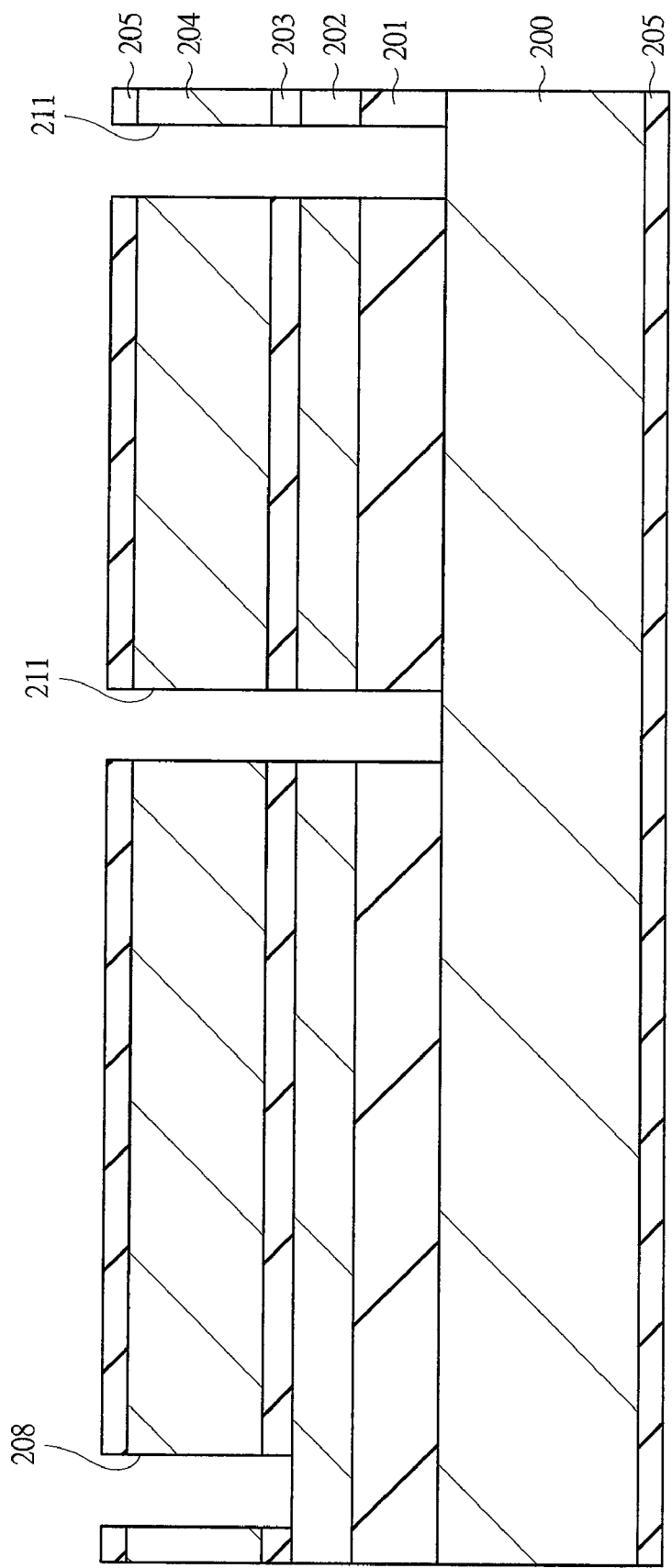
FIG. 24 is a cross-sectional view showing a manufacturing step of the semiconductor device continued from FIG. 23.

Subsequently, as shown in FIG. 24, opening portions 211 are formed by etching using the patterned resist film 209 as a mask. The opening portions 211 penetrate through the silicon nitride film 205, the silicon layer 204, the second buried insulating film 203, the intermediate layer 202, and the first buried insulating film 201, and reach the substrate layer 200. After that, the resist film 209 is removed, and then the SOI substrate is cleaned. As a result, the resist film 209 buried in the opening portion 208 is also removed.

Figure 25:
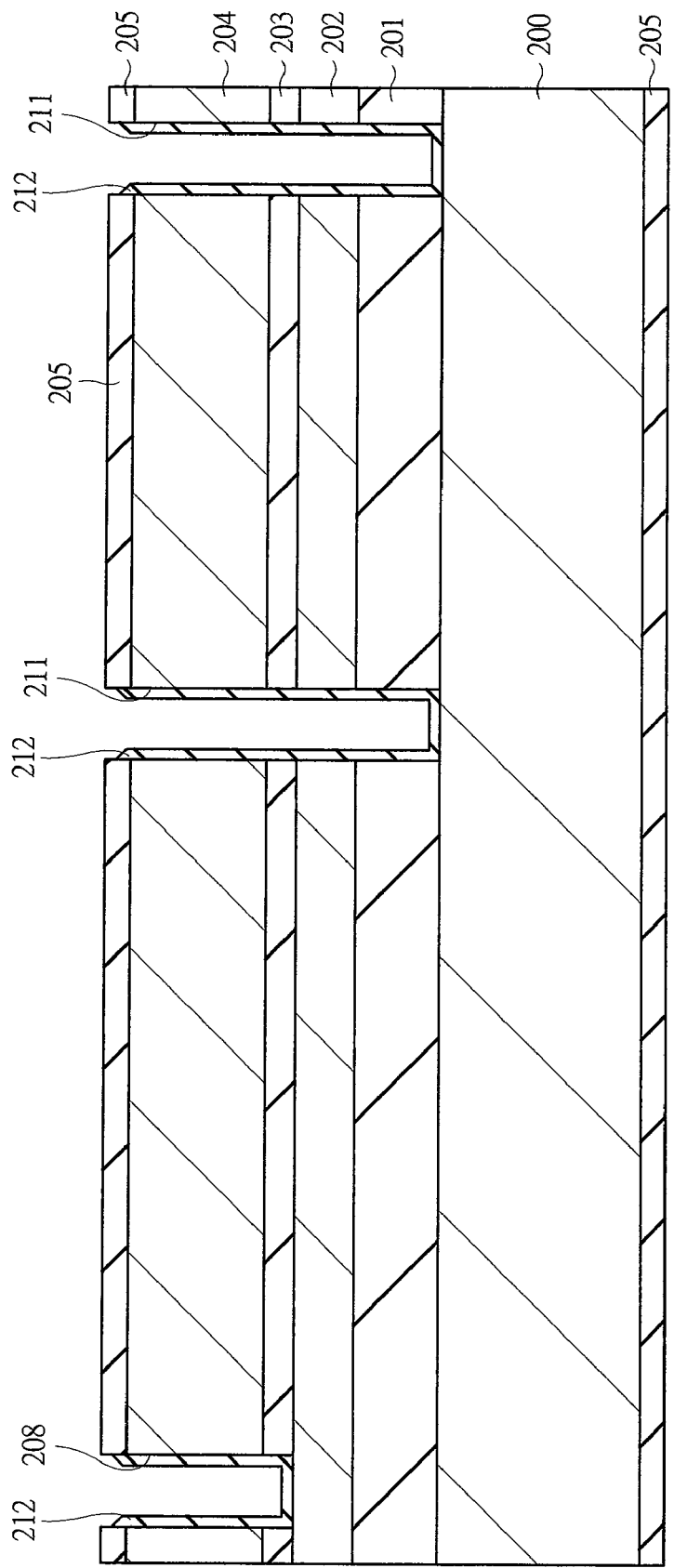
FIG. 25 is a cross-sectional view showing a manufacturing step of the semiconductor device continued from FIG. 24.

Next, as shown in FIG. 25, the inner wall of the opening portion 208 and the inner walls of the opening portions 211 are oxidized, thereby forming silicon oxide films 212 on the inner wall of the opening portion 208 and the inner walls of the opening portions 211. At this time, the silicon layer 204 and the second buried insulating layer 203 are exposed on the inner wall of the opening portion 208; and the silicon layer 204, the second buried insulating layer 203, the intermediate layer 202, and the first buried insulating layer 201 are exposed on the inner walls of the opening portions 211. Therefore, when the inner wall of the opening portions 208 and the inner walls of the opening portions 211 are oxidized, growth speeds of the silicon oxide films are different since the types of the base films exposed on the inner walls are different. Therefore, the film thicknesses of the silicon oxide films formed on the inner wall of the opening portion 208 and the inner walls of the opening portions 211 are not uniform and are different depending on the location.

Figure 26:
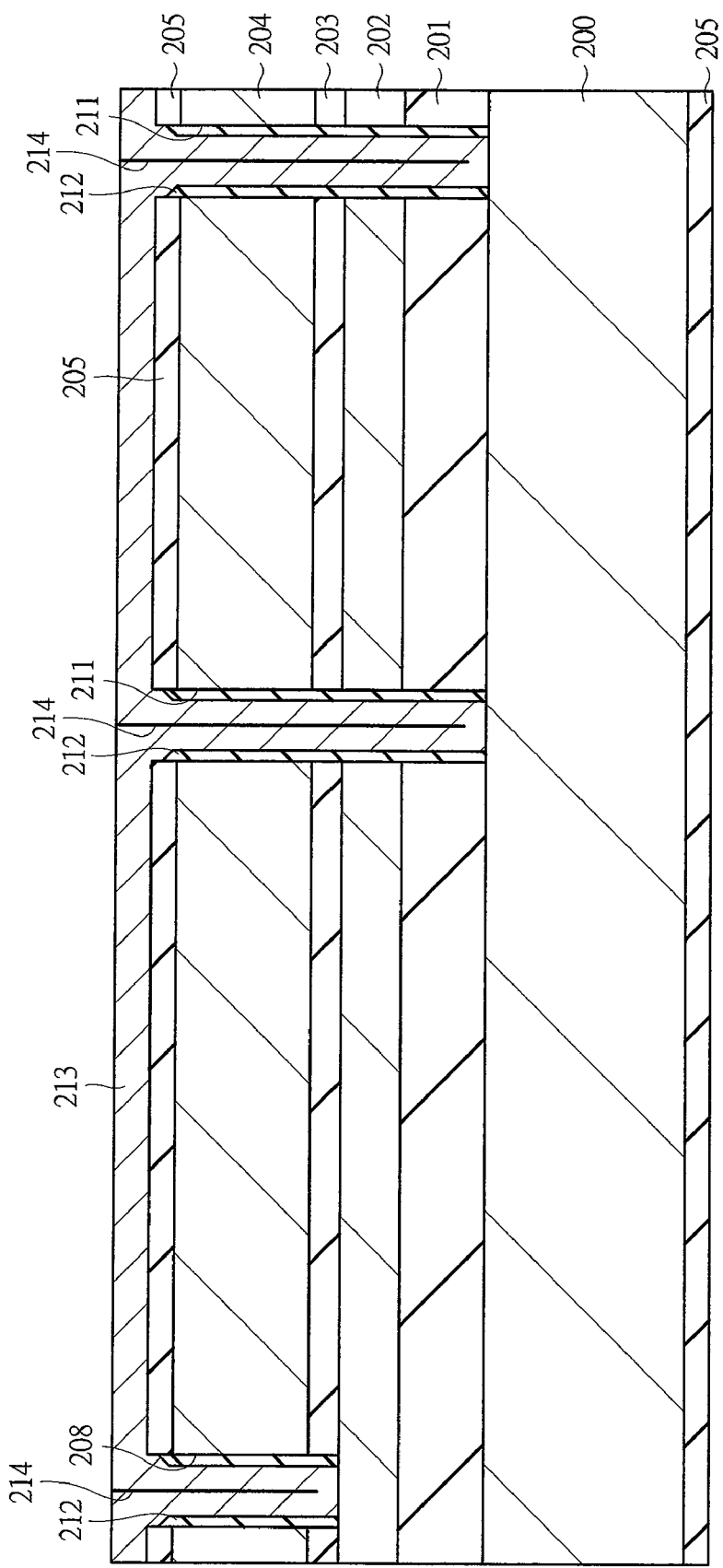
FIG. 26 is a cross-sectional view showing a manufacturing step of the semiconductor device continued from FIG. 25.

Then, as shown in FIG. 26, after the silicon oxide films 212 formed on the bottom portion of the opening portion 208 and the bottom portion of the opening portions 211 are removed by etching, the SOI substrate is cleaned. Then, a polysilicon film 213 into which a conductive-type impurity is introduced is formed on the silicon nitride film 205, including on the interior of the opening portion 208 and the interiors of the opening portions 211. In this process, the polysilicon film 213 is buried in the interior of the opening portion 208 and in the interiors of the opening portions 211. At this time, while the silicon oxide films 212 are formed on the sidewall of the opening portion 208 and on the sidewalls of the opening portions 211, the film thicknesses thereof are not uniform; therefore, when the polysilicon film 213 is buried in the opening portion 208 and the opening portions 211, voids 214 are formed. In order to suppress generation of the voids 214 when the polysilicon film 213 is buried in the opening portion 208 and the opening portions 211, conceivably, instead of the abovedescribed step of oxidizing the inner wall of the opening portion 208 and the inner walls of the opening portions 211, a step of forming sidewall spacers on the sidewall of the opening portion 208 and on the sidewalls of the opening portions 211 can be carried out by carrying out an etch back after a silicon oxide film is deposited on the interior of the opening portion 208 and on the interiors of the opening portions 211 by using CVD method. However, even when the voids 214 are generated when the polysilicon film 213 is buried in the opening portion 208 and the opening portions 211, there is no problem. This is for the reason that the influence of the voids 214 is eliminated since a film is deposited above the through-electrodes in a step thereafter.

Figure 27:
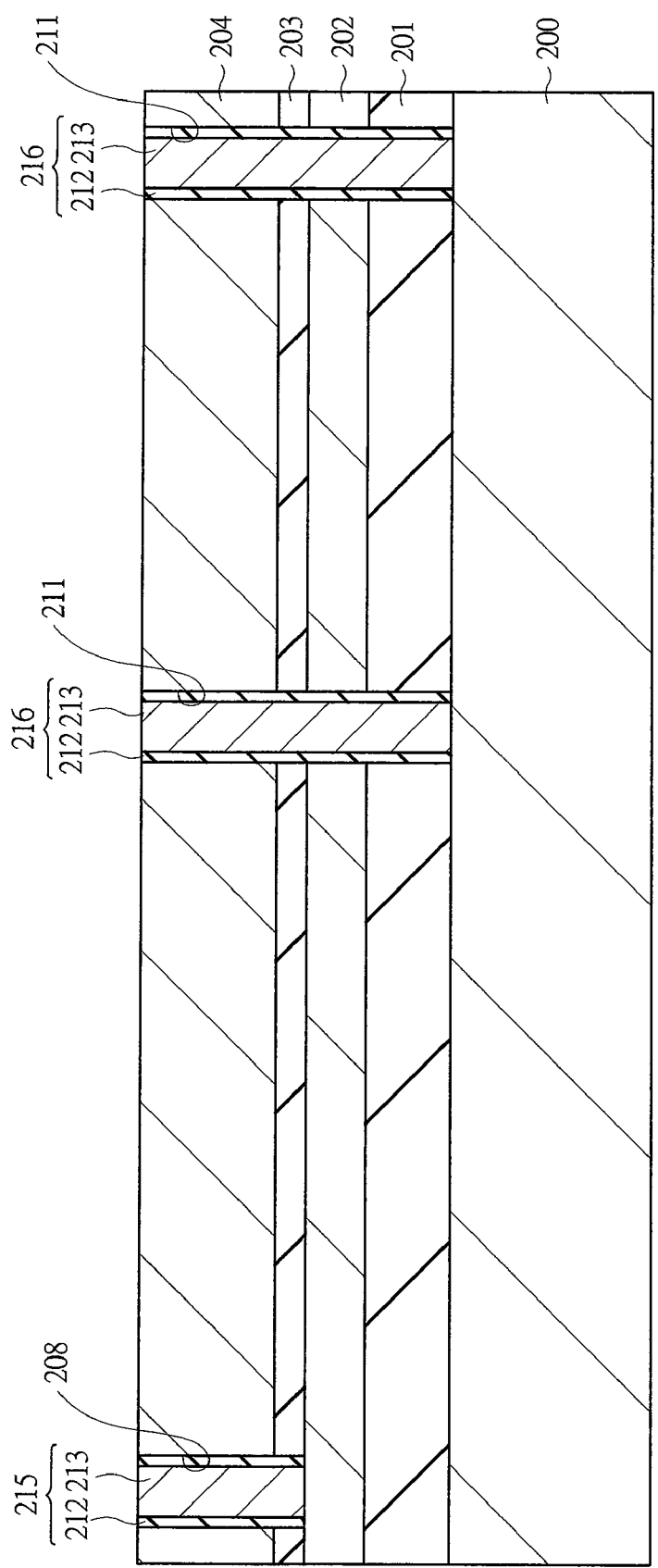
FIG. 27 is a cross-sectional view showing a manufacturing step of the semiconductor device continued from FIG. 26.

Next, as shown in FIG. 27, the unnecessary polysilicon film 213 formed on the silicon nitride film 205 is removed by an etch-back method or CMP method, and the silicon nitride film 205 which is exposed when the polysilicon film 213 is removed is then removed by a hot phosphoric acid, etc. As a result, the through-electrodes 215 and 216 in which the polysilicon film 213 is buried can be formed. More specifically, the through-electrode 215 which penetrates through the silicon layer 204 and the second buried insulating layer 203 and reaches the intermediate layer 202, and the through-electrodes 216 which penetrate through the silicon layer 204, the second buried insulating layer 203, the intermediate layer 202, and the first buried insulating layer 201 and reaches the substrate layer 200 can be formed. Since the silicon oxide films 212 are formed on the sidewalls of the through-electrode 215 and the through-electrodes 216, the insulating properties of the sidewalls are ensured. In this manner, the plurality of through-electrodes 215 and 216 having different connection destinations can be formed in the SOI substrate.

Herein, in the second embodiment, the polysilicon film 213 is used as the material to be buried in the through-electrodes 215 and 216. From the viewpoint of reducing the resistance of the through-electrodes 215 and 216, a metal film of, for example, copper is desired to be used as the conductive material to be buried in the through-electrodes 215 and 216. However, in the second embodiment, the through-electrodes 215 and 216 are formed before the MISFETs which constitute the integrated circuit. Therefore, if a metal film is used as the material to be buried in the through-electrodes 215 and 216, the surface of the metal film is oxidized in a high-temperature thermal treatment step that is carried out in a step of forming the MISFETs. Consequently, it is feared that the resistance of the through-electrodes 215 and 216 may be increased, and, furthermore, it may become difficult to ensure the conductive state of the through-electrodes 215 and 216. Accordingly, in the second embodiment, the polysilicon film 213 is used as the material to be buried in the through-electrodes 215 and 216.

Figure 28:
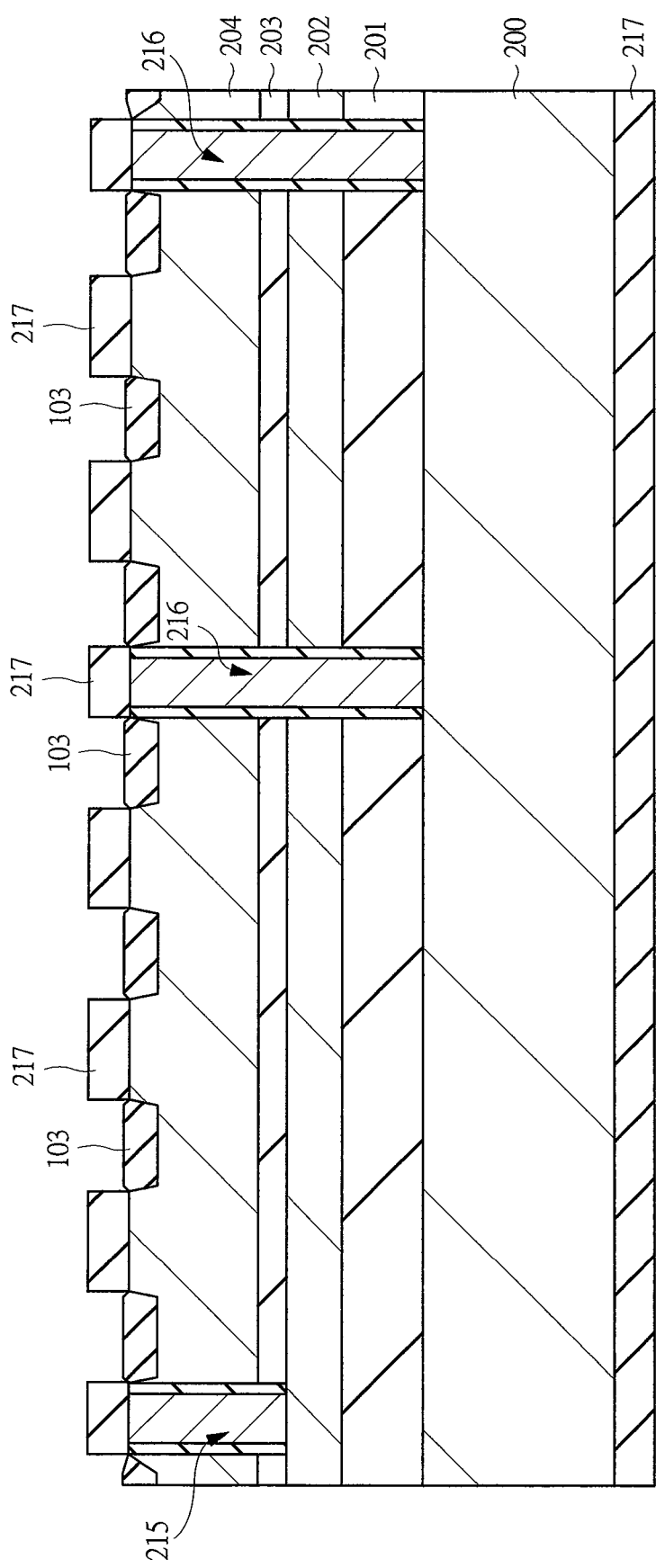
FIG. 28 is a cross-sectional view showing a manufacturing step of the semiconductor device continued from FIG. 27.

Next, a step of forming the integrated circuit on the silicon layer 204 of the SOI substrate will be described. First of all, as shown in FIG. 28, after the surface of the silicon layer 204 is oxidized, a silicon nitride film 217 is formed on the silicon layer 204. Then, the silicon nitride film 217 is patterned by using photolithography technique and etching technique. The patterning of the silicon nitride film 217 is carried out so as to open formation regions of the isolation regions. Then, the silicon layer 204 of the SOI substrate is subjected to selective oxidation, thereby forming the isolation regions 103 in the silicon layer 204. In this process, the silicon nitride film 217 is formed also on the through-electrodes 215 and 216 so that the surfaces of the through-electrodes 215 and 216 are not oxidized.

Figure 29:
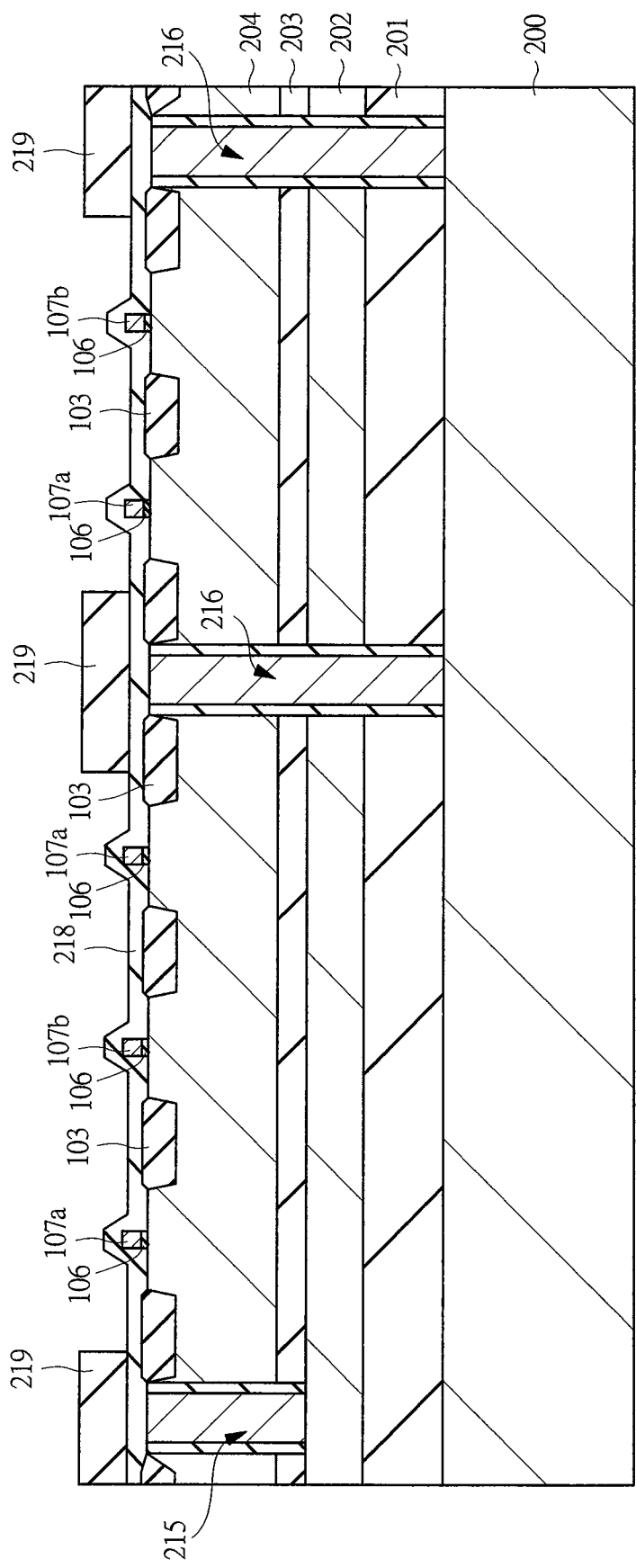
FIG. 29 is a cross-sectional view showing a manufacturing step of the semiconductor device continued from FIG. 28.

Subsequently, as shown in FIG. 29, the gate insulating film 106 is formed on the silicon layer 204. Then, a polysilicon film is formed on the gate insulating film 106. The polysilicon film can be formed by using, for example, CVD method. Then, an n-type impurity such as phosphorous and arsenic is introduced into the polysilicon film that is formed in the n-channel type MISFET formation region by using photolithography technique and ion implantation method. Similarly, a p-type impurity such as boron is introduced into the polysilicon film that is formed in the p-channel type MISFET formation region.

Next, the polysilicon film is processed by etching using a patterned resist film as a mask, thereby forming the gate electrodes 107a in the n-channel type MISFET formation regions and forming the gate electrodes 107b in the p-channel type MISFET formation regions.

Subsequently, shallow n-type impurity diffusion regions (not shown) aligned with the gate electrodes 107a of the n-channel type MISFETs are formed by using photolithography technique and ion implantation method. The shallow n-type impurity diffusion regions are semiconductor regions. Similarly, shallow p-type impurity diffusion regions (not shown) are formed in the p-channel type MISFET formation regions. The shallow p-type impurity diffusion regions are formed so as to be aligned with the gate electrode 107b of the p-channel type MISFETs. The shallow p-type impurity diffusion regions can be formed by using photolithography technique and ion implantation method. When the impurity is to be introduced by the ion implantation method, the surfaces of the through-electrodes 215 and 216 are covered by a mask such as a resist film. This is for the reason that it is feared that the resistance of the through-electrodes 215 and 216 may be increased if the impurity is introduced into the through-electrodes 215 and 216. More specifically, in the second embodiment, the polysilicon film 213 is used as the conductive material buried in the through-electrodes 215 and 216. As described above, since the shallow n-type impurity diffusion regions and the shallow p-type impurity diffusion regions are formed, if the ion implantation is carried out without covering the through-electrodes 215 and 216 by a mask, the n-type impurity or the p-type impurity will be introduced into the polysilicon film 213. Then, since the through-electrode 215 is connected to the intermediate layer 202 of the SOI substrate and the through-electrode 216 is connected to the substrate layer 200 of the SOI substrate, a pn junction is formed between these layers and the through-electrodes 215 and 216 depending on the conduction type of the semiconductor regions constituting the intermediate layer 202 and the substrate layer 200. This is not desirable from the viewpoint of conductivity. Therefore, the ion implantation is carried out with covering the upper portions of the through-electrodes 215 and 216 by a mask.

Figure 30:
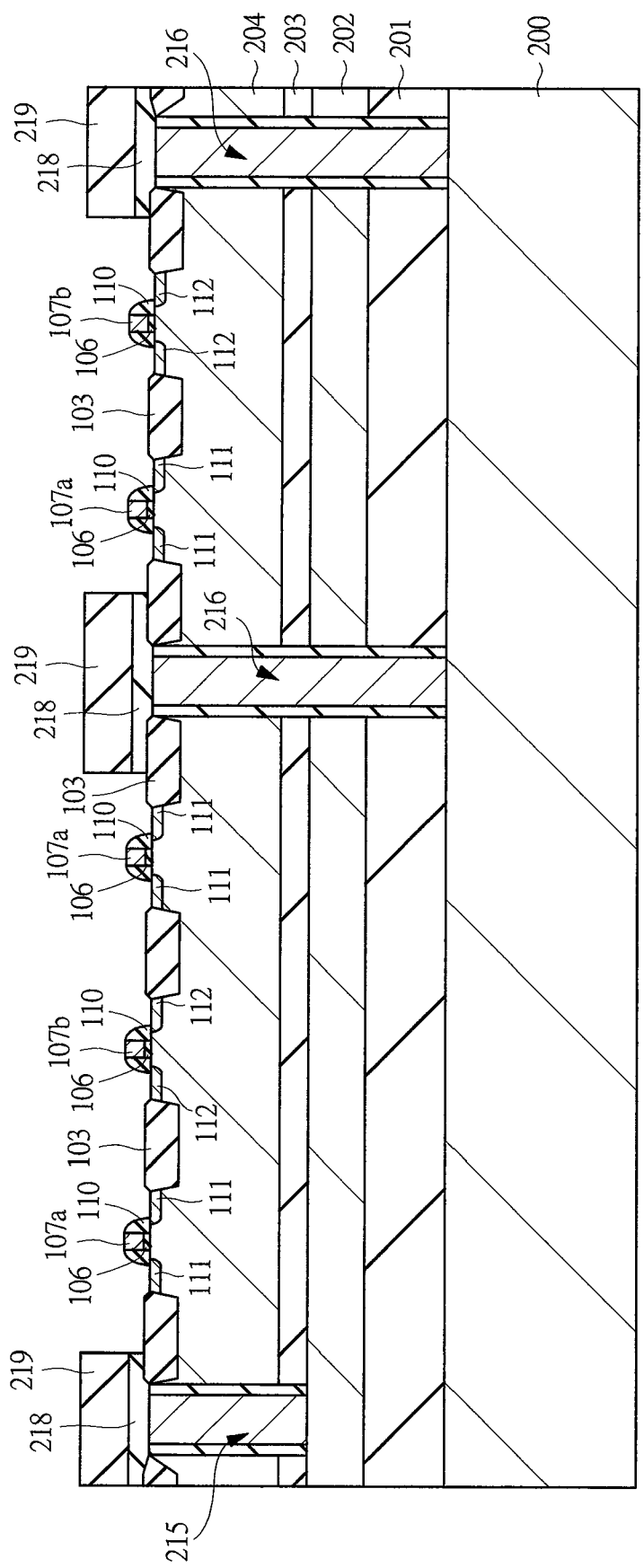
FIG. 30 is a cross-sectional view showing a manufacturing step of the semiconductor device continued from FIG. 29.

Next, a silicon oxide film 218 is formed on the silicon layer 204 of the SOI substrate. The silicon oxide film 218 can be formed, for example, by using CVD method. Then, the silicon oxide film 218 is subjected to anisotropic etching. At this time, the tops of the through-electrodes 215 and 216 are covered by a resist film 219. This is for preventing the surfaces of the through-electrodes 215 and 216 from being etched when the silicon oxide film 218 is removed by the anisotropic etching. When the exposed silicon oxide film 218 is subjected to anisotropic etching in this state, the sidewalls 110 are formed on the side walls of the gate electrodes 107a and 107b as shown in FIG. 30.

Subsequently, by using the photolithography technique and ion implantation method, the deep n-type impurity diffusion regions 111 aligned with the sidewalls 110 are formed in the n-channel type MISFET formation regions. Similarly, the deep p-type impurity diffusion regions 112 aligned with the sidewalls 110 are formed in the p-channel type MISFET formation regions. Same as the previous case, when the impurities are to be introduced by the ion implantation method, the surfaces of the through-electrodes 215 and 216 are covered by the resist film 219. This is for the reason that, it is feared that, if the impurities are introduced into the through-electrodes 215 and 216, the resistance of the through-electrodes 215 and 216 may be increased.

Then, after the resist film 219 is removed, a cobalt film is formed on the SOI substrate. At this time, the cobalt film is formed so as to be in direct contact with the gate electrodes 107a and 107b. Similarly, the cobalt film is also in direct contact with the deep n-type impurity diffusion regions 111 and the deep p-type impurity diffusion regions 112.

Herein, same as the abovedescribed first embodiment, the resistances of the surfaces of the gate electrodes 107a and 107b and the diffusion layer regions (the deep n-type impurity diffusion regions 111 and the deep p-type impurity diffusion regions 112) are reduced by forming silicide thereon by titanium, cobalt, and nickel.

Figure 31:
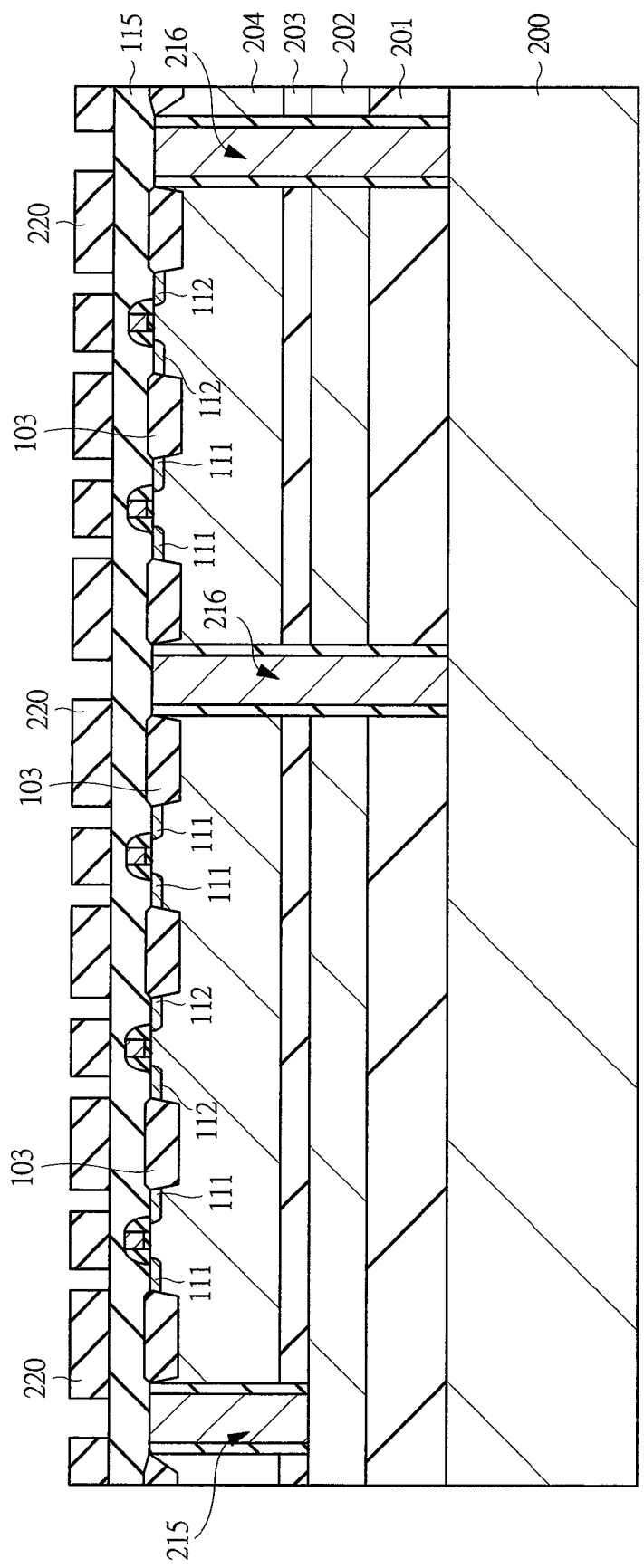
FIG. 31 is a cross-sectional view showing a manufacturing step of the semiconductor device continued from FIG. 30.

Next, as shown in FIG. 31, a silicon oxide film which will serve as the interlayer insulating film 115 is formed on the silicon layer 204 of the SOI substrate. The silicon oxide film can be formed, for example, by using the CVD method using TEOS (tetra ethyl ortho silicate) as a raw material. Then, the surface of the silicon oxide film is planarized, for example, by using CMP (Chemical Mechanical Polishing) method. After that, a resist film 220 is formed on the interlayer insulating layer 115. Then, the resist film 220 is patterned by using photolithography technique. The patterning of the resist film 220 is carried out so as to open contact hole formation regions.

Figure 32:
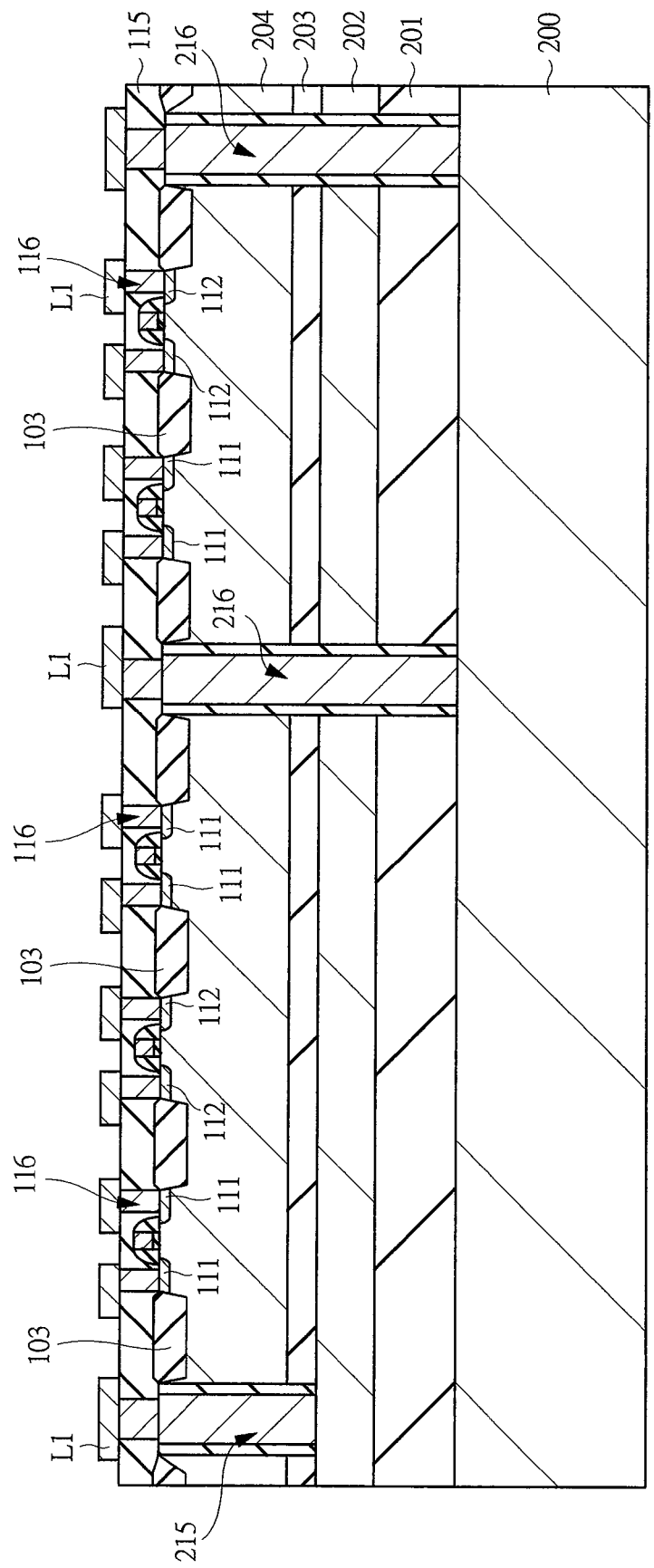
FIG. 32 is a cross-sectional view showing a manufacturing step of the semiconductor device continued from FIG. 31.

Subsequently, as shown in FIG. 32, by using etching technique, contact holes are formed in the silicon oxide film. Then, a titanium/titanium nitride film is formed on the silicon oxide film including the bottom surfaces and inner walls of the contact holes. The titanium/titanium nitride film is formed by a stacked film of a titanium film and a titanium nitride film and it can be formed, for example, by using sputtering method. The titanium/titanium nitride film has a so-called barrier property that prevents, for example, tungsten, which is a material of a film to be buried in a later step, from being diffused into silicon.

Subsequently, a tungsten film is formed on the entire surface of the silicon oxide film formed on the silicon layer 204 of the SOI substrate to be buried in the contact holes. The tungsten film can be formed, for example, by using CVD method. Then, the unnecessary titanium/titanium nitride film and the tungsten film formed on the silicon oxide film are removed, for example, by CMP method, thereby forming the plugs 116. The plugs 116 are formed so as to be connected also to the through-electrodes 215 and 216.

Next, the first-layer wiring L1 is formed on the interlayer insulating film 115. As for the first-layer wiring L1, a titanium/titanium nitride film, an aluminium film containing copper, and a titanium/titanium nitride film are sequentially formed on the interlayer insulating film 115. These films can be formed, for example, by using sputtering method. Subsequently, these films are subjected to patterning by using photolithography technique and etching technique, thereby forming the first-layer wiring L1. At this time, the first-layer wiring L1 is formed also on the through-electrodes 215 and 216.

Figure 33:
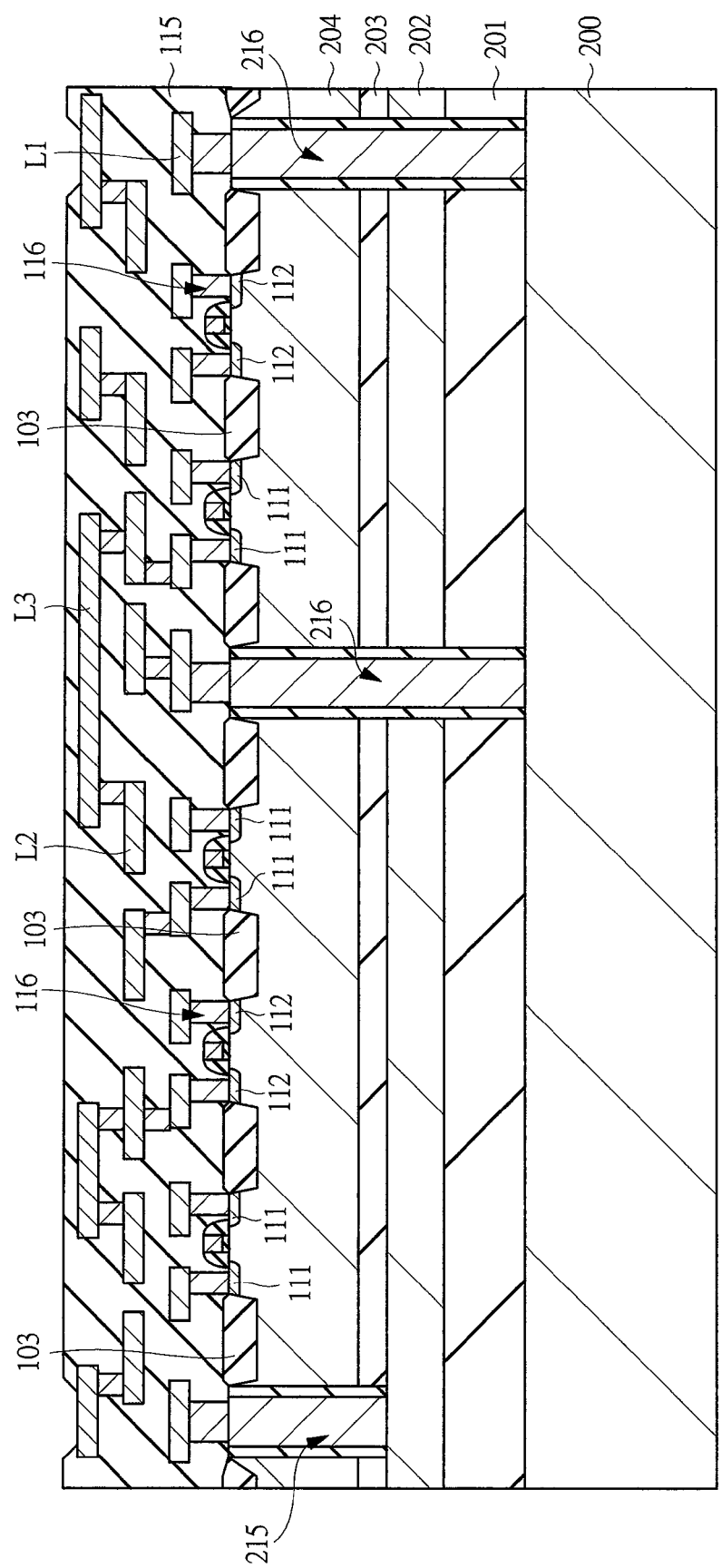
FIG. 33 is a cross-sectional view showing a manufacturing step of the semiconductor device continued from FIG. 32.

Subsequently, as shown in FIG. 33, the interlayer insulating film 115 is formed on the first-layer wiring L1, and the interlayer insulating film 115 is planarized, and then plugs connected to the first-layer wiring L1 are formed. Then, the second-layer wiring L2 is formed so as to be connected to the plugs. Furthermore, through similar steps, the third-layer wiring L3 is formed on the second-layer wiring L2. Same as the first-layer wiring L1, the second-layer wiring L2 and the third-layer wiring L3 can be formed by, for example, a stacked film of a titanium/titanium nitride film, an aluminium film, and a titanium/titanium nitride film. Then, a passivation film which will serve as a surface protective film is formed on the third-layer wiring L3, and opening portions are formed in the passivation film so as to expose part of the third-layer wiring L3 to form bonding pads.

In the abovedescribed manner, the integrated circuit having the MISFETs and the wirings can be formed on the silicon layer 204 of the SOI substrate. The second embodiment has a feature lies in the point that the step of forming the through-electrodes is added in addition to the normal MISFET formation steps and wiring steps, where the MISFET formation steps and the wiring steps are carried out by normal techniques.

Next, a step of forming the MEMS sensor at the substrate layer 200 side (the back surface side of the silicon layer 204 interposing the first buried insulating layer 201) of the SOI substrate will be described. Before patterning of the substrate layer 200 side, a thickness reducing process of the SOI substrate can be carried out. In this case, a more reduction of the thickness of a completed chip can be achieved. The thickness of the substrate layer 200, respective electrode gaps of the MEMS sensor structure, etc. may be adjusted and fabricated, in accordance with the sensitivity of a detection circuit of, for example, capacity detection of the LSI circuit.

In patterning of the substrate layer 200 side, same as the abovedescribed first embodiment, an adhesive layer is formed on a support substrate, and the side of the silicon layer 204 of the SOI substrate is caused to adhere to the adhesive layer.

Then, a resist film is formed on the substrate layer 200 of the SOI substrate, and the resist film is patterned. The patterning is carried out so that the structure of the MEMS sensor can be formed by etching the substrate layer 200 using the resist film as a mask.

Figure 34:
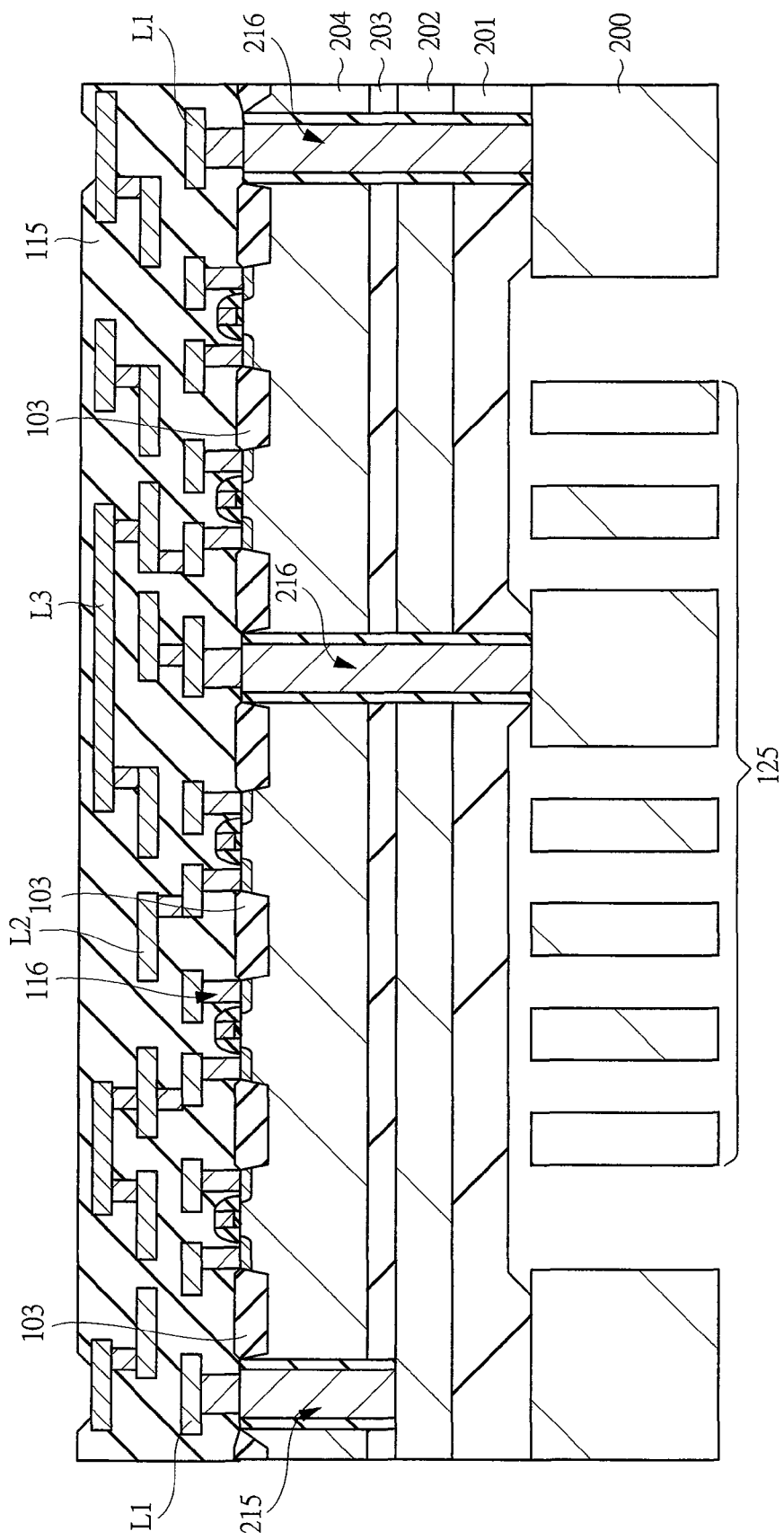
FIG. 34 is a cross-sectional view showing a manufacturing step of the semiconductor device continued from FIG. 33.

Subsequently, as shown in FIG. 34, the structure 125 of the MEMS sensor is formed in the substrate layer 200 by etching the substrate layer 200 with using the resist film as a mask. The structure 125 is formed so as to include the elastically deformable beams and the masses connected to the fixing portions formed in the substrate layer 200.

After that, the resist film is removed, and the first buried insulating layer 201 fixing the structure 125 is isotropically etched. Consequently, the structure 125 is separated from the first buried insulating layer 201 and caused to be in a movable state.

Next, the support substrate is exfoliated from the SOI substrate. Then, as shown in FIG. 19, the fixing portions (substrate layer 200) of the MEMS sensor and the cap 127 are bonded (metal bonding) by the metal 126, thereby hermetically sealing the structure 125 of the MEMS sensor. In the abovedescribed manner, the MEMS sensor can be formed in the substrate layer 200 of the SOI substrate. Instead of the metal bonding, glass anodic bonding using glass as the cap material may be employed. When the glass anodic bonding is employed, a high electric field is applied via the glass; therefore, it is effective to subject the bonding-surface side of the glass to shielded-electrode treatment.

In the second embodiment, the example in which the through-electrodes 215 and 216 are formed before formation of the MISFETs, which constitute the integrated circuit, has been described; however, same as the abovedescribed first embodiment, the through-electrodes 215 and 216 may be formed after the MISFETs are formed. Also in this case, it can be realized by a method equivalent to that of the first embodiment. Furthermore, in the second embodiment, the three-layer wiring is taken as an example and described as multi-layered wirings constituting the integrated circuit; however, the wiring is not limited thereto, but may be a multilayered wiring including more than three layers of wirings or less wiring layers.

According to the second embodiment, in the SOI substrate having the substrate layer 200, the first buried insulating layer 201 buried in the substrate layer 200, the intermediate layer 202 formed on the first buried insulating layer 201, the second buried insulating layer 203 formed on the intermediate layer 202, and the silicon layer 204 formed on the second buried insulating layer 203, while the integrated circuit is formed on the silicon layer 204, the MEMS sensor can be formed by processing the substrate layer 200. More specifically, the integrated circuit is formed on one surface of the SOI substrate, and the MEMS sensor can be formed on the other side thereof, thereby realizing downsizing and thickness reduction compared with the case where the MEMS sensor and the integrated circuit are formed on separate semiconductor chips.

In addition, in the employed configuration, the integrated circuit formed on the silicon layer 204 and the MEMS sensor formed in the substrate layer 200 are directly connected by the through-electrodes 216. Therefore, although the parasitic capacitance fluctuations between the wires are generated if the integrated circuit and the MEMS sensor are connected by wire bonding, in the configuration in which the integrated circuit and the MEMS sensor are directly connected to each other by the through-electrodes 216, the parasitic capacitance fluctuations can be suppressed, and the sensitivity and detection accuracy of the MEMS sensor can be improved. Furthermore, the other through-electrode 215 which reaches the intermediate layer 202 of the SOI substrate from the integrated circuit formed in the silicon layer 204 is also provided. When the through-electrodes having different connection destinations are formed in this manner, various connection relations can be built. More specifically, the intermediate layer 202 of the SOI substrate also can be caused to function as part of the wiring, and the flexibility of electrical connection of the integrated circuit and the MEMS sensor can be improved.

As described above, when the MEMS sensor and the integrated circuit are formed on the same SOI substrate, and the MEMS sensor and the integrated circuit are electrically connected to each other by the through-electrodes 216, both downsizing and thickness reduction of the semiconductor device, and sensitivity enhancement and detection accuracy improvement can be achieved.

Furthermore, even when the structure constituting the MEMS sensor is hermetically sealed, external draw-out electrodes can be provided on the side where the integrated circuit is provided; therefore, it is not necessary to form opening portions in the cap, which hermetically seals the structure, so as to form external draw-out electrodes. Therefore, the step of hermetically sealing the structure constituting the MEMS sensor can be simplified, and reliability of the bonding surfaces of the cap and the MEMS sensor can be improved.

According to the present first and second embodiments, the MEMS sensor such as the acceleration sensor and the angular rate sensor using bulk micromachining technique and the integrated circuit (LSI) can be integrated on one semiconductor chip. Further, the electrical connection between the MEMS sensor and the integrated circuit is realized by the through-electrodes. Therefore, since it is not necessary to form external draw-out electrodes to the cap, which hermetically seals the structure serving as a movable portion of the MEMS sensor in the cavity portion, the steps can be simplified, and reliability of hermetic sealing can be improved. The semiconductor devices according to the present first and second embodiments can be built in a substrate of an upper-level system by chip packaging; therefore, packaging cost can be reduced, and the packaging area can be also reduced.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention can be widely utilized in a manufacturing industry that manufactures semiconductor devices.

What is claimed is:

1. A semiconductor device comprising:
    (a) an SOI substrate having a substrate layer, a buried insulating layer formed on the substrate layer, and a semiconductor layer formed on the buried insulating layer;
    (b) an integrated circuit formed on the semiconductor layer of the SOI substrate; and
    (c) a semiconductor element formed by processing the substrate layer of the SOI substrate, wherein
    the integrated circuit has:
    (b1) a plurality of MISFETs formed on the semiconductor layer; and
    (b2) a plurality of wirings in at least two wiring layers, which electrically connect the plurality of MISFETs, wherein
    the semiconductor element has:
    (c1) a fixing portion formed by processing the substrate layer;
    (c2) a structure mechanically connected to the fixing portion and movable;
    (c3) a cavity portion formed so as to surround the structure, and
    (c4) a cap hermetically sealing the structure, wherein the integrated circuit and the semiconductor element are electrically connected, and the electrical connection between the integrated circuit and the semiconductor element is achieved by a through-electrode formed inside the SOI substrate, wherein a first part of an uppermost wiring layer of the plurality of wirings is covered by an insulating film, wherein a second part of the uppermost wiring layer is exposed from the insulating film, and wherein the integrated circuit is arranged to be connected to an outside of the semiconductor device via the second part of the uppermost-layer wiring.

2. The semiconductor device according to claim 1, wherein the semiconductor element is a sensor which detects a capacitance change between the fixing portion and the structure according to a displacement of the structure caused by an external force.

3. The semiconductor device according to claim 2, wherein the through-electrode is formed by burying a conductive material in a hole, and an insulator is formed between a sidewall of the hole and the conductive material.

4. The semiconductor device according to claim 3, wherein the through-electrode connects the wiring forming the integrated circuit and the substrate layer forming the semiconductor element.

5. The semiconductor device according to claim 1, wherein the integrated circuit is not arranged to be connected to the outside of the semiconductor device via the cap.

6. The semiconductor device according to claim 2, wherein the structure has a mass and an elastically deformable beam that connects the mass and the fixing portion.

7. The semiconductor device according to claim 6, wherein the semiconductor element is an acceleration sensor or an angular rate sensor.

8. A semiconductor device comprising:
(a) an SOI substrate having a substrate layer, a first buried insulating layer formed on the substrate layer, an intermediate layer formed on the first buried insulating layer, a second buried insulating layer formed on the intermediate layer, and a semiconductor layer formed on the second buried insulating layer;
(b) an integrated circuit formed on the semiconductor layer of the SOI substrate; and
(c) a semiconductor element formed by processing the substrate layer of the SOI substrate, wherein
the integrated circuit has:
(b1) a plurality of MISFETs formed on the semiconductor layer; and
(b2) a wiring which electrically connects the plurality of MISFETs, wherein
the semiconductor element has:
(c1) a fixing portion formed by processing the substrate layer;
(c2) a structure mechanically connected to the fixing portion and movable; and
(c3) a cavity portion formed so as to contain the structure in the inside, wherein
the integrated circuit and the semiconductor element are electrically connected, and the electrical connection between the integrated circuit and the semiconductor element is achieved by a first through-electrode formed inside the SOI substrate,
wherein the first through-electrode is connected to the wiring forming the integrated circuit and the substrate layer forming the semiconductor element,
wherein the electrical connection between the wiring of the integrated circuit and the intermediate layer is achieved by a second through-electrode formed in the inside of the SOI substrate, and
wherein the intermediate layer has a same electrical potential as the structure.

9. The semiconductor device according to claim 8, wherein a plurality of the first through-electrodes are provided.

10. The semiconductor device according to claim 9, wherein
the plurality of first through-electrodes are mutually connected by the wiring forming the integrated circuit.

* * * * *